United States Patent
Wang et al.

(10) Patent No.: US 12,366,693 B2
(45) Date of Patent: Jul. 22, 2025

(54) IMAGE SENSOR

(71) Applicant: VisEra Technologies Company Limited, Hsin-Chu (TW)

(72) Inventors: Chun-Yuan Wang, Hsin-Chu (TW); Yu-Chi Chang, Hsin-Chu (TW); Po-Hsiang Wang, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 528 days.

(21) Appl. No.: 17/964,240

(22) Filed: Oct. 12, 2022

(65) Prior Publication Data

US 2024/0125995 A1    Apr. 18, 2024

(51) Int. Cl.
| | |
|---|---|
| G02B 5/30 | (2006.01) |
| G02B 5/20 | (2006.01) |
| H10F 39/00 | (2025.01) |
| H10F 39/18 | (2025.01) |
| H10K 30/40 | (2023.01) |
| H10K 39/32 | (2023.01) |

(52) U.S. Cl.
CPC ........... *G02B 5/3025* (2013.01); *G02B 5/201* (2013.01); *H10F 39/182* (2025.01); *H10F 39/8053* (2025.01); *H10F 39/806* (2025.01); *H10F 39/8063* (2025.01); *H10F 39/807* (2025.01); *H10K 30/40* (2023.02); *H10K 39/32* (2023.02)

(58) Field of Classification Search
CPC ..... G02B 5/3025; G02B 5/201; H10F 39/182; H10F 39/8053; H10F 39/806; H10F 39/8063; H10F 39/807; H10K 30/40; H10K 39/32; H10K 30/87; H10K 39/621
See application file for complete search history.

(56) References Cited

U.S. PATENT DOCUMENTS

2023/0239552 A1* 7/2023 Miyata ................ H10F 39/8023
                                                       348/272

FOREIGN PATENT DOCUMENTS

| JP | 2020051868 A | 4/2020 |
|---|---|---|
| JP | 2021057422 A | 4/2021 |
| JP | 2022075462 A | 5/2022 |

\* cited by examiner

*Primary Examiner* — Tony Ko
(74) *Attorney, Agent, or Firm* — MUNCY, GEISSLER, OLDS & LOWE, P.C.

(57) ABSTRACT

An image sensor includes a group of sensor units and a color filter layer disposed within the group of sensor units. The image sensor further includes a dielectric structure and a plurality of polarization splitters disposed corresponding to the color filter layer. Each of the plurality of polarization splitters has a first meta element extending in a first direction from top view and a second meta element extending in a second direction from top view. The second direction is perpendicular to the first direction.

20 Claims, 19 Drawing Sheets

IMAGE SENSOR

BACKGROUND

Technical Field

The present disclosure relates to an image sensor, and it particularly relates to the polarization splitters of the image sensor.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light-sensing portion of an image sensor can detect ambient color change, and signal electric charges may be generated, depending on the amount of light received in the light-sensing portion. In addition, the signal electric charges generated in the light-sensing portion may be transmitted and amplified, whereby an image signal is obtained.

Conventionally, a plurality of polarization splitters may be designed to allow incident light waves of a specific polarization to be transmitted, while incident light waves of other polarizations are either reflected away or absorbed by the polarization splitters. When an image sensor incorporates a plurality of polarization splitters, the image sensor may only receive a portion of the optical energy (since the other portions are blocked by the polarization splitters). This leads to optical energy loss, which compromises the performance of the image sensor. Therefore, these and related issues need to be addressed through the design and manufacture of the image sensor.

SUMMARY

In an embodiment, an image sensor includes a group of sensor units and a color filter layer disposed within the group of sensor units. The image sensor further includes a dielectric structure and a plurality of polarization splitters disposed corresponding to the color filter layer. Each of the plurality of polarization splitters has a first meta element extending in a first direction from top view and a second meta element extending in a second direction from top view. The second direction is perpendicular to the first direction.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
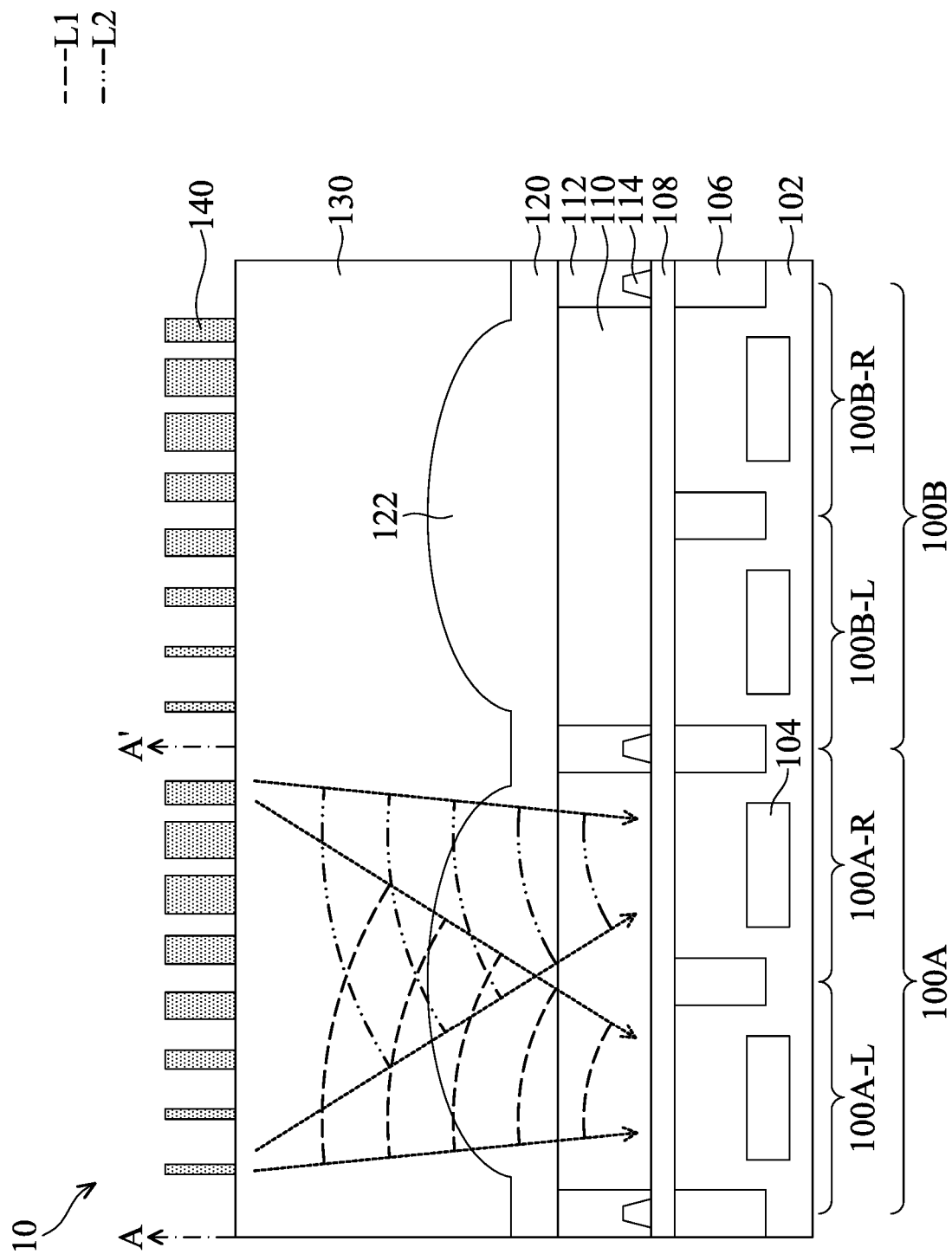
FIG. 1A is a cross-sectional view of an image sensor, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In response to the continually reduced pixel size, light reception of each pixel, and light reception uniformity between pixels have become a critical concern. One method of enhancing the light reception uniformity of smaller pixels among the image sensor is to integrate a group of sensor units. According to some embodiments of the present disclosure, when a light is evenly received by each sensor unit within the group, the image sensor can display image of unifying color. However, if the light received by each sensor unit is uneven, then the image sensor would experience color variation. While the group of sensor units may detect and track image focus for the overall device, it also allows the determination of color by signals received. Normally, there is one single micro-lens disposed above the entire group of sensor units (such as the group of Phase Difference Auto Focus pixels). In other words, all sensor units within the group shares one single micro-lens, while other sensor units each has one micro-lens disposed on top. The single micro-lens above the group of sensor units may enable the light to converge together for tracking and detecting. For example, when the light is entered at an inclined angle, one of the sensor units within the group may receive a higher intensity of the light than another sensor unit, and thus based on the signal reading between the sensor units, the entry light direction may be accurately determined.

The present disclosure incorporates a plurality of polarization splitters into the group of sensor units, in order for the image sensor to have the capability to distinguish incident light waves of different polarizations. In nature, light may possess horizontal electric field and vertical electric field of equivalent intensity. Through polarization, light waves with a certain intended direction of electric field (for example, horizontal or vertical) can be extracted for treatment or analysis. A conventional polarization splitter (or a polarizer) may allow light waves of a designated polarization to transmit, and may reflect away or absorb light waves of unwanted polarizations. For example, when an incident light wave located far away has a reflection angle larger than the Brewster's angle, the light wave may only have the horizontal polarization. Through the necessary polarizer, the reflection of the light wave may be completely invisible. Even though the conventional polarization splitter may filter the intended polarized light waves, the other polarized light waves being blocked still represent a portion of the optical energy loss. For instance, the conventional polarization splitter may convert optical energy into heat for dissipation. If sensing portions embedded within the group of sensor units cannot acquire sufficient optical energy, the quantum efficiency (QE) of the image sensor may be severely compromised. Whenever the quantum efficiency is inadequate, the device may be difficult to apply into the environment of low luminance (such as a night vision apparatus) or camera within moving vehicles (such as a real time video).

The inventor has discovered that by configuring each of the polarization splitter to have an innovative meta feature, the incident light waves of every polarization may be transmitted for reception. Furthermore, the meta feature may control the transmitting direction of different polarized light waves, allowing the light waves of different polarizations to be directed toward different sensing portions within the group of sensor units. The meta feature is intended to vary the phase of the wavefront (or to bend the wavefront) corresponding to different positions, and eventually to construct a new wavefront corresponding to a new propagating direction relative to the original incident light wave (the propagating direction of light wave is defined to be perpendicular to the corresponding wavefront). These new light waves are designed to travel toward the desired targets. For example, the meta feature may provide different phase delays (or different phase speeds) that split the light waves into different propagating directions corresponding to the respective polarizations of the light waves. Under different phase speeds along the polarization splitters, an inclined and bent wavefront may be generated that enable the light waves to travel at an off-normal direction to the point of entry and to be self-focusing. Such characteristics, through proper manipulation, may allow, for example, horizontally polarized light waves and vertically polarized light waves to travel toward the sensing portions for horizontal polarization (x-axis direction from top view) and the sensing portions for vertical polarization (y-axis direction from top view), respectively. As a result, the optical energy loss may be minimized, while the quantum efficiency may be optimized. With adequate quantum efficiency, the displayed image may be restored into the original luminance with higher resolution through post-treatment, and the polarization data analysis may also be carried out more comprehensively.

FIG. 1A is a cross-sectional view of an image sensor 10, according to some embodiments of the present disclosure. In some embodiments, image sensors may contain millions of sensor units in reality. For the sake of brevity, FIG. 1A only displays a portion of an actual image sensor. The image sensor 10 shown in FIG. 1A includes two groups of sensor units 100A and 100B disposed adjacent to each other. From the top view of one of the groups of sensor units 100A and 100B (shown in FIG. 1B), each of the groups of sensor units 100A and 100B may include four sensor units arranged in 2×2 or two sensor units arranged in 1×2, but the present disclosure is not limited thereto. For example, the group of sensor units 100A and the group of sensor units 100B may correspond to m×n photoelectric conversion elements, in which m and n are positive integers that can be the same or different, but the present disclosure is not limited thereto. For illustration purpose, the group of sensor units 100A and the group of sensor units 100B both include one left sensor unit and one right sensor units. In particular, the group of sensor units 100A includes a left sensor unit 100A-L and a right sensor unit 100A-R, and the group of sensor units 100B includes a left sensor unit 100B-L and a right sensor unit 100B-R.

Please note that, as shown in FIG. 1A, one micro-lens 122 may be disposed corresponding to each of the group of sensor units 100A and the group of sensor units 100B. A dielectric structure 130 and a plurality of polarization splitters 140 may be sequentially disposed on the plurality of micro-lenses 122. The meta feature of the plurality of polarization splitters 140 will be described with more details in reference with FIG. 1B. A deep trench isolation (DTI) structure 106 may be disposed surrounding each of the left sensor unit 100A-L, the right sensor unit 100A-R, the left sensor unit 100B-L, and the right sensor unit 100B-R. In other words, the deep trench isolation structure 106 may serve as a boundary that defines the size of each of the left sensor unit 100A-L, the right sensor unit 100A-R, the left sensor unit 100B-L, and the right sensor unit 100B-R.

Referring to FIG. 1A, each of the group of sensor units 100A and the group of sensor units 100B includes a plurality of sensing portions 104, a color filter layer 110, and the micro-lens 122. The plurality of sensing portions 104 and the deep trench isolation structure 106 may be embedded in a substrate 102. In some embodiments, the substrate 102 may be a single structure shared by all sensor units of the image sensor 10. Furthermore, an anti-reflection layer 108 may be disposed on the substrate 102.

In some embodiments, the substrate 102 may be, for example, a wafer or a chip, but the present disclosure is not limited thereto. In some embodiments, the substrate 102 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In some embodiments, the substrate 102 may be a photoelectric conversion substrate, such as a silicon substrate or an organic photoelectric conversion layer (to be described with more details in reference with FIG. 7).

In other embodiments, the substrate 102 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 102 may be an n-type or a p-type conductive type.

In some embodiments, the substrate 102 may include various p-type doped regions and/or n-type doped regions (not shown) formed by, for example, an ion implantation and/or a diffusion process. In some embodiments, transistors, photodiodes, or the like, may be formed at the active regions, defined by the deep trench isolation structure 106.

In some embodiments, the deep trench isolation structure 106 may define active regions, and electrically isolate active region elements within or above the substrate 102, but the present disclosure is not limited thereto. In other embodiments, additional isolation structures may be applied as an alternative. Shallow trench isolation (STI) structures and local oxidation of silicon (LOCOS) structures are examples of other isolation structures. In some embodiments, the formation of the deep trench isolation structure 106 may include, for example, forming an insulating layer on the substrate 102. Through a photolithography patterning and etching, trenches may be formed extending into the substrate 102. The photolithography process may include resist coating, soft baking, exposure, post-exposure baking, development, the like, or a combination thereof. The etching process may include dry etching, wet etching, the like, or a combination thereof.

Next, a liner of rich nitrogen-containing materials (such as silicon oxynitride (SiON)) may be grown conformally along the trenches. After that, insulating materials (such as silicon dioxide ($SiO_2$), silicon nitride (SiN), or silicon oxynitride) may be filled into the trenches by any suitable deposition processes, such as chemical vapor deposition (CVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), the like, or a combination thereof. An annealing process may then be performed on the insulating materials in the trenches, followed by a planarization process, such as chemical mechanical polish (CMP), on the substrate 102 to remove excessive insulating materials, so the insulating materials in the trenches are level with the top surface of the substrate 102.

Still referring to FIG. 1A, the anti-reflection layer 108 is disposed on the substrate 102. In some embodiments, the anti-reflection layer 108 is configured to decrease the reflection of the light being transmitted to the plurality of sensing portions 104. In some embodiments, the anti-reflection layer 108 is disposed horizontally in correspondence (or parallel with respect) to the array of sensing portions 104. In some embodiments, the materials of the anti-reflection layer 108 may include $SiO_xN_y$, (wherein x and y are in the range of 0 to 1). The anti-reflection layer 108 may be formed by any suitable deposition processes.

As mentioned above, the group of sensor units 100A and the group of sensor units 100B may each include a color filter layer 110 disposed on the anti-reflection layer 108. In some embodiments, the height of the color filter layer 110 may be approximately between 0.3 μm and 2.0 μm. In a particular embodiment, the height of the color filter layer 110 may be approximately 0.7 μm. In some embodiments, the color filter layer 110 may include multiple units, which may be colored red, green, blue, cyan, magenta, yellow, white, clear (colorless), or infrared. Each unit of the color filter layer 110 may corresponds to one respective sensing portion 104 of the image sensor 10, and the color of the unit depends on the requirement of each of the group of sensor units 100A and the group of sensor units 100B. The respective sensing portions 104, such as photodiodes, may convert received light signals into electric signals for each of the group of sensor units 100A and the group of sensor units 100B. In some embodiments, the sensor units within the same group may have the same color units. In some embodiments, the group of sensor units 100A and the group of sensor units 100B are separated from each other by the partition grid structure 112, which will be explained in detail later. According to some embodiments of the present disclosure, the color filter layer 110 is deposited on the anti-reflection layer 108 and in the space defined by the partition grid structure 112. The color filter layer 110 may be formed in sequence by a coating, exposure, and development process at different steps. Alternatively, the color filter layer 110 may be formed by ink-jet printing.

Referring to FIG. 1A, the partition grid structure 112 is disposed between one or more units of the color filter layer 110. For example, the center line (not shown) of the partition grid structure 112 may define the border of the group of sensor units 100A and the group of sensor units 100B. According to some embodiments of the present disclosure, the partition grid structure 112 may have a lower refractive index than each unit of the color filter layer 110. The refractive index is a characteristic of a substance that changes the speed of light, and it is a value obtained by dividing the speed of light in vacuum by the speed of light in the substance. When light travels between two different materials at an angle, its refractive index determines the angle of light transmission (refraction). According to some embodiments of the present disclosure, the refractive index of the partition grid structure 112 is approximately between 1.00 and 1.99. When an incident light wave enters the color filter layer 110, the partition grid structure 112 may isolate the light within the specific unit to serve as the light-trapping function.

Materials of the partition grid structure 112 may include a transparent dielectric material. At first, a partition material layer is coated on the anti-reflection layer 108. Next, a hard mask layer (not shown) is coated on the partition material layer. In some embodiments, the material of the hard mask layer may be a photoresist. A photolithography process is performed on the hard mask layer for patterning. Next, an etching process is performed on the partition material layer by using the patterned hard mask layer. The etching process may be dry etching. After the etching process, a portion of the partition material layer is removed on the anti-reflection layer 108, and multiple openings are formed therein. As mentioned previously, the openings will be subsequently filled with the color filter layer 110.

Still referring to FIG. 1A, a light shielding structure 114 is disposed on the anti-reflection layer 108 between the group of sensor units 100A and the group of sensor units 100B. In some embodiments, the light shielding structure 114 is embedded within the partition grid structure 112. In some embodiments, the partition grid structure 112 may be higher than or equal to the light shielding structure 114, depending on the design requirements for the image sensors 10. In some embodiments, the light shielding structure 114 spans across the border of the group of sensor units 100A and the group of sensor units 100B. In other words, the light shielding structure 114 may be disposed in a way shared by any two adjacent sensor units (for example, the right sensor unit 100A-R and the left sensor unit 100B-L). The arrangement of the light shielding structure 114 may prevent one of the sensing portions 104 under the corresponding unit of the color filter layer 110 to receive additional light from an adjacent unit of different color, which may affect the accuracy of signals received. In some embodiments of the present disclosure, the height of the light shielding structure 114 may be approximately between 0.005 µm and 0.4 µm. In some embodiments, materials of the light shielding structure 114 may include opaque metals (such as tungsten (W), aluminum (Al)), opaque metal nitride (such as titanium nitride (TiN)), opaque metal oxide (such as titanium oxide (TiO)), other suitable materials, or a combination thereof, but the present disclosure is not limited thereto. The light shielding structure 114 may be formed by depositing a metal layer on the anti-reflection layer 108 and then patterning the metal layer using photolithography and etching processes, but the present disclosure is not limited thereto.

Referring to FIG. 1A, the micro-lens material layer 120 may be disposed on the color filter layer 110 and the partition grid structure 112. The refractive index of the micro-lens material layer 120 is approximately between 1.2 and 2.2. In some embodiments, materials of the micro-lens material layer 120 may be a transparent material. For example, the materials may include glass, epoxy resin, silicone resin, polyurethane, any other applicable material, or a combination thereof, but the present disclosure is not limited thereto. According to some embodiments of the present disclosure, the plurality of micro-lenses 122 may be disposed on the micro-lens material layer 120. In some embodiments, the plurality of micro-lenses 122 may be formed by patterning the top portion of the micro-lens material layer 120 to correspond to each of the group of sensor units 100A and the group of sensor units 100B. Because the plurality of micro-lenses 122 are formed from the micro-lens material layer 120, the plurality of micro-lenses 122 and the micro-lens material layer 120 share the same material.

Still referring to FIG. 1A, the dielectric structure 130 may be disposed on the plurality of micro-lenses 122. In some embodiments, the dielectric structure 130 may cover the micro-lens material layer 120 and the plurality of micro-lenses 122. According to some embodiments of the present disclosure, the dielectric structure 130 may provide the necessary travel path for light waves of different polarizations to reach their respective targets, for example, light waves L1 and L2 (to be explained in detail later). The refractive index of the dielectric structure 130 is approximately between 1.0 and 1.8. The refractive index of the dielectric structure 130 may be lower than that of the micro-lens 122 (and the micro-lens material layer 120). Moreover, the refractive index of the dielectric structure 130 is significantly lower than that of the subsequently formed polarization splitters 140. It should be understood that, in order to more effectively split the light waves into different phase delays, it is required to create a maximum difference between the refractive indices of the polarization splitters 140 and the surrounding environment, so a larger phase difference may be generated.

In some embodiments, the dielectric structure 130 may be a transparent material including, for example, silicon oxide (SiO), silicon nitride, silicon carbide, silicon carbonitride (SiCN), silicon oxynitride, silicon oxynitrocarbide (Si-$O_xN_yC_{1-x-y}$, wherein x and y are in a range from 0 to 1), tetra ethyl ortho silicate (TEOS), undoped silicate glass, or doped silicon oxide (such as boron-doped phosphosilicate glass (BPSG), fused silica glass (FSG), phosphosilicate glass (PSG), boron doped silicon glass (BSG), or the like), low-k dielectric materials, organic transparent materials, the like, or a combination thereof, but the present disclosure is not limited thereto. The formation of the dielectric structure 130 may include deposition processes, which may include, for example, spin-on coating process, chemical vapor deposition, physical vapor deposition (PVD), atomic layer deposition (ALD), other suitable methods, or a combination thereof. After that, a planarization process, such as chemical mechanical polish, may be performed to form a planarized top surface.

Referring to FIG. 1A, the plurality of polarization splitters 140 may sit on the planarized top surface of the dielectric structure 130. As mentioned previously, conventional polarization splitters (or polarizers) may only allow incident light waves of a specific polarization to transmit, and may reflect away or absorb incident light waves of other polarizations. The plurality of polarization splitters 140 may be incorporated with the meta feature, which allows light waves of different polarizations to transmit. In other words, the optical energy loss may be minimized, while the quantum efficiency may be enhanced. In some embodiments, the quantum efficiency is the photoelectrical transferring efficiency, which is the measure of how efficient the incident light waves can be converted into electrical signal.

The refractive index of the plurality of polarization splitters 140 is approximately between 1.7 and 3.5. It is worth noted that, the plurality of polarization splitters 140 may be surrounded by ambient air, which has the refractive index of 1. The largest difference between the refractive indices may be realized to generate a significantly large phase difference, so the light waves may be split into different phase delays with different bent wavefronts. The height of the plurality of polarization splitters 140 is approximately between 0.1 µm and 1.5 µm. Materials of the polarization splitters 140 may include transparent resins, such as polyethylene terephthalate (PET) resins, polycarbonate (PC) resins, polyimide (PI) resins, polymethylmethacrylates (PMMA), polystyrene resins, polyethersulfone (PES) resins, polythiophene (PT) resins, phenol novolac (PN), the like, or combinations thereof.

The plurality of polarization splitters 140 may be formed by any suitable deposition process and patterning process mentioned above.

In a specific embodiment of the present disclosure, the left sensor unit 100A-L and the left sensor unit 100B-L may be designed for vertical polarization, while the right sensor unit 100A-R and the right sensor unit 100B-R may be designed for horizontal polarization. As shown in FIG. 1A (which will also be described with more details in reference with FIG. 1B), the portions of the plurality of polarization splitters 140 directly above the left sensor unit 100A-L and the left sensor unit 100B-L are mainly dominated by the vertical polarization splitters, and the portions of the plurality of polarization splitters 140 directly above the right sensor unit 100A-R and the right sensor unit 100B-R are mainly dominated by the horizontal polarization splitters. It is worth noted that the meta feature of each of the plurality of polarization splitters 140 may include both vertical polarization and horizontal polarization, instead of having only one type of polarization and completely excluding the other type.

Still referring to FIG. 1A, the light wave L1 and the light wave L2 are of vertical polarization and horizontal polarization, respectively. The light wave L1 and the light wave L2 may each be transmitted from a same area that corresponds to the sensor units including both vertical polarization and horizontal polarization (within the group of sensor units 100A or the group of sensor units 100B). Since the light wave L1 and the light wave L2 are transmitted through the plurality of polarization splitters 140, the light wave L1 and the light wave L2 may obtain the different phase delays. Due to the different phase delays, an inclined and bent wavefront may be generated that enable the light wave L1 to travel at an off-normal direction to the point of entry, while the travel path for the light wave L2 may be gradually shifted to another direction relative to the off-normal direction of the light wave L1.

As shown in FIG. 1A, the light wave L1 may travel toward the sensing portions 104 of the left sensor unit 100A-L and the left sensor unit 100B-L, while the light wave L2 may travel through a mirror path relative to the path of the light wave L1 toward the sensing portions 104 of the right sensor unit 100A-R and the right sensor unit 100B-R. As a result of implementing the meta feature of the plurality of polarization splitters 140, the light wave L1 of vertical polarization and the light wave L2 of horizontal polarization may both be properly received by the sensing portions 104 of vertical polarization and the sensing portions 104 of horizontal polarization, respectively. Therefore, the meta feature may lead to a higher sensitivity, and the transmittance rate may reach approximately 70% to 80%. In some embodiments, the transmittance rate may be the ratio of the optical energy received by the left sensor unit 100A-L to the total incident energy (the incident light waves of vertical polarization) entering the group of sensor units 100A, or the ratio of the optical energy received by the right sensor unit 100A-R to the total incident energy (the incident light waves of horizontal polarization) entering the group of sensor units 100A.

Figure 1B:
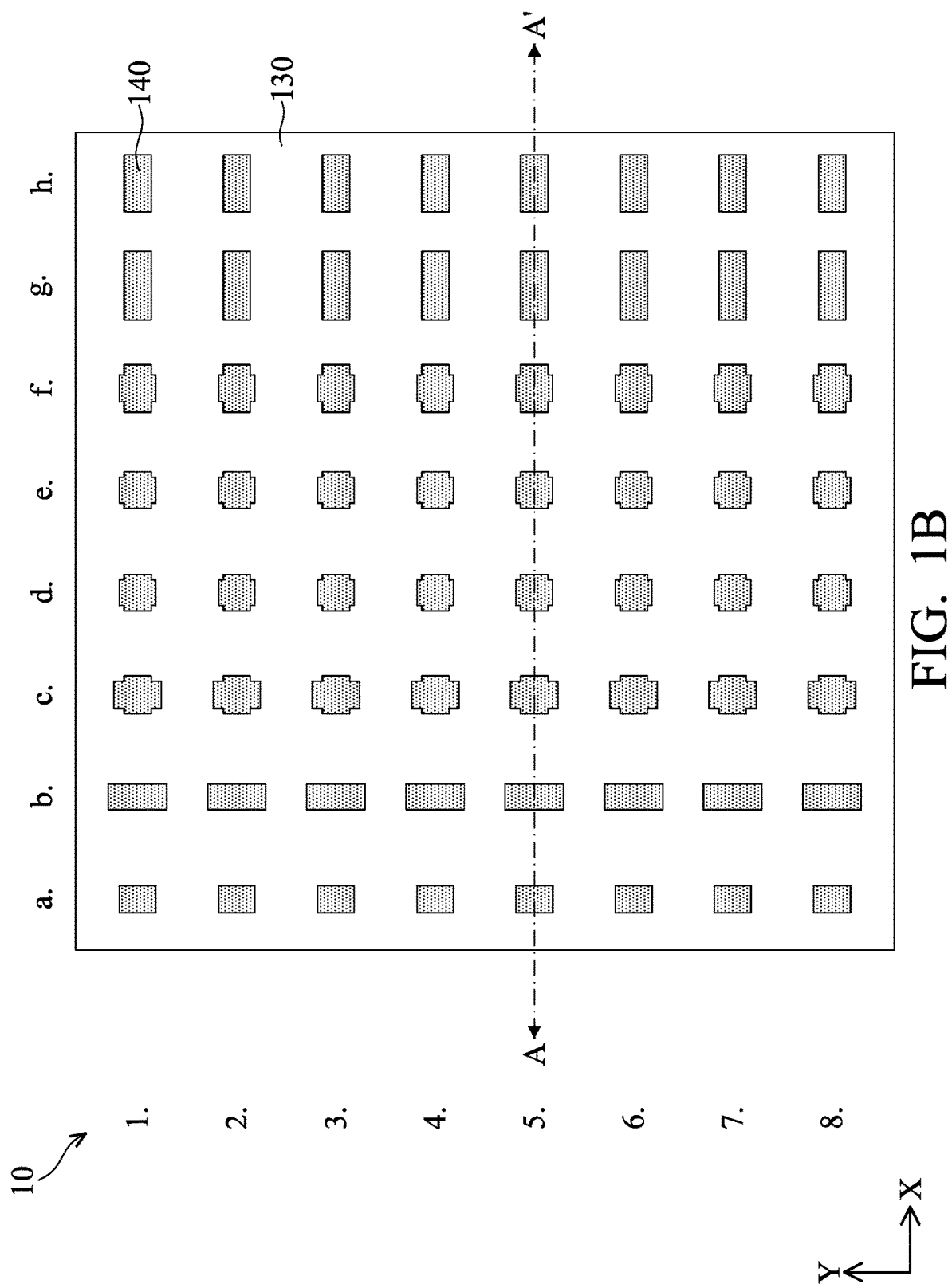
FIG. 1B is a top view of the image sensor, according to some embodiments of the present disclosure.

FIG. 1B is a top view of the image sensor 10, according to some embodiments of the present disclosure. It should be noted that FIG. 1A is the cross-sectional view obtained from a line A-A' of FIG. 1B. As mentioned, each of the group of sensor units 100A or the group of sensor units 100B may include four sensor units arranged in 2×2, such as a quad photodiode (QPD). In other embodiments, each of the group of sensor units 100A or the group of sensor units 100B may include two sensor units arranged in 1×2, such as a dual photodiode (DPD). For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1A, and the details are not described again herein to avoid repetition. For the sake of brevity, FIG. 1B only displays the top view of the group of sensor units 100A (or the group of sensor units 100B). As mentioned previously, the plurality of polarization splitters 140 may sit on the dielectric structure 130 across the group of sensor units 100A (or the group of sensor units 100B).

Referring to FIG. 1B, each of the plurality of polarization splitters 140 may be a unit that has a first meta element extending in a first direction from the top view and a second meta element extending in a second direction perpendicular to the first direction from top view. The first direction and the second direction will be denoted hereafter as the y-axis direction and the x-axis direction, respectively. For clarity, the plurality of polarization splitters 140 may be indicated by rows 1-8 (in the y-axis direction) and columns a-h (in the x-axis direction). It should be noted that, the polarization splitters 140 from column a to column h of each row constitute a structural group, and the structural group may be repeatedly arranged in cycles from row 1 to row 8. In other words, each structural group may extend in the x-axis direction, and may be repeated in cycles in the y-axis direction. It should be understood that the structural group does not correspond to a single sensor unit, instead the structural group should span across all the sensor units within the group. In other embodiments, each structural group may also extend in the y-axis direction, and may be repeated in cycles in the x-axis direction, as long as the configuration of group of sensor units is adjusted accordingly. According to some embodiments of the present disclosure, each structural group should be constituted by at least three polarization splitters 140.

As shown in FIG. 1B, each of the plurality of polarization splitters 140 in every structural group may be a cross shape or a rectangular shape. It should be understood that, whether the polarization splitters 140 appear to be cross shapes or rectangular shapes, they can all be considered as cross shapes. For example, the polarization splitters 140 in column a may appear to have only the first meta element extending only in the y-axis direction (the first direction). This is simply because the second meta element extending in the x-axis direction (the second direction) does not extend beyond the critical dimension (CD) of the first meta element. Similarly, the polarization splitters 140 in column h may appear to have only the second meta element extending only in the x-axis direction (the second direction). This is also because the first meta element extending in the y-axis direction (the first direction) does not extend beyond the critical dimension of the second meta element. Therefore, the plurality of polarization splitters 140 of the present embodiment may all be considered as cross shapes having the innovative meta feature.

Still referring to FIG. 1B, the polarization splitters 140 in column a to column d may be located corresponding to the sensor units of vertical polarization (such as the left sensor unit 100A-L and the left sensor unit 100B-L), while the polarization splitters 140 in column e to column h may be located corresponding to the sensor units of horizontal polarization (such as the right sensor unit 100A-R and the right sensor unit 100B-R). However, the polarization splitters 140 in column a to column h may support the vertical polarization and the horizontal polarization simultaneously. The critical dimension of the first meta element or the second meta element of each of the plurality of polarization splitters 140 is approximately between 50 nm and 300 nm from the top view. The length (or the extending dimension) of the first meta element or the second meta element of each of the plurality of polarization splitters 140 is approximately between 50 nm and 400 nm from the top view. Since the polarization splitters 140 within every structural group have different extending dimension in the x-axis direction, the splitter pitch (or the x-axis pitch) within every structural group may vary. The splitter pitch between the plurality of polarization splitters 140 within every structural group is approximately between 200 nm and 600 nm. Similarly, since the polarization splitters 140 of every structural group have different extending dimension in the y-axis direction, the group pitch (or the y-axis pitch) between cycles of the structural groups may also vary at different positions. The group pitch between the cycles of the structural groups is approximately between 200 nm and 600 nm. In some embodiments, the splitter pitch and the group pitch may be the same or different. The splitter pitch and the group pitch may be designed for visible light range.

Figure 2A:
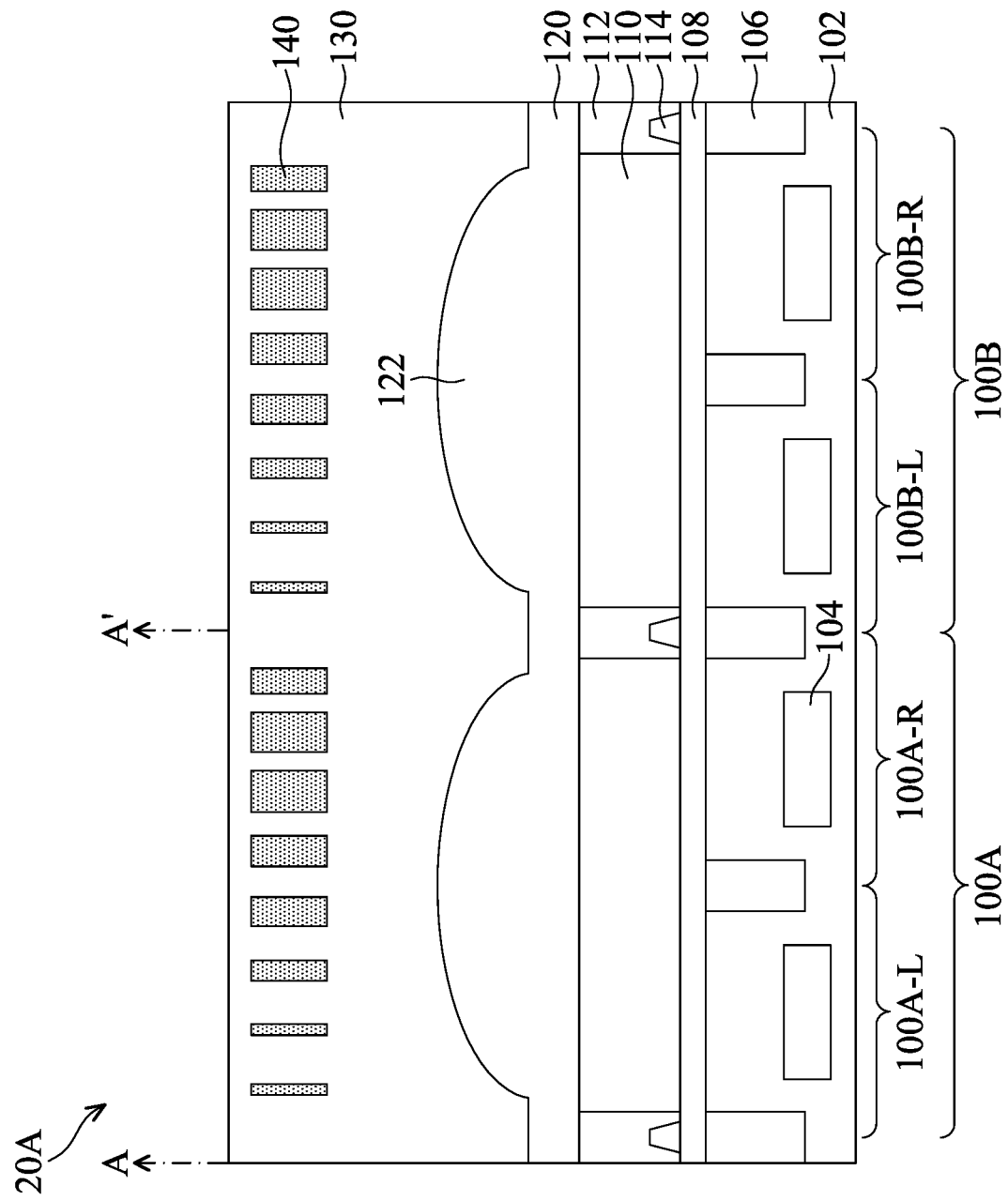
FIGS. 2A-2C are cross-sectional views of image sensors with various designs, according to some embodiments of the present disclosure.
Figure 2B:
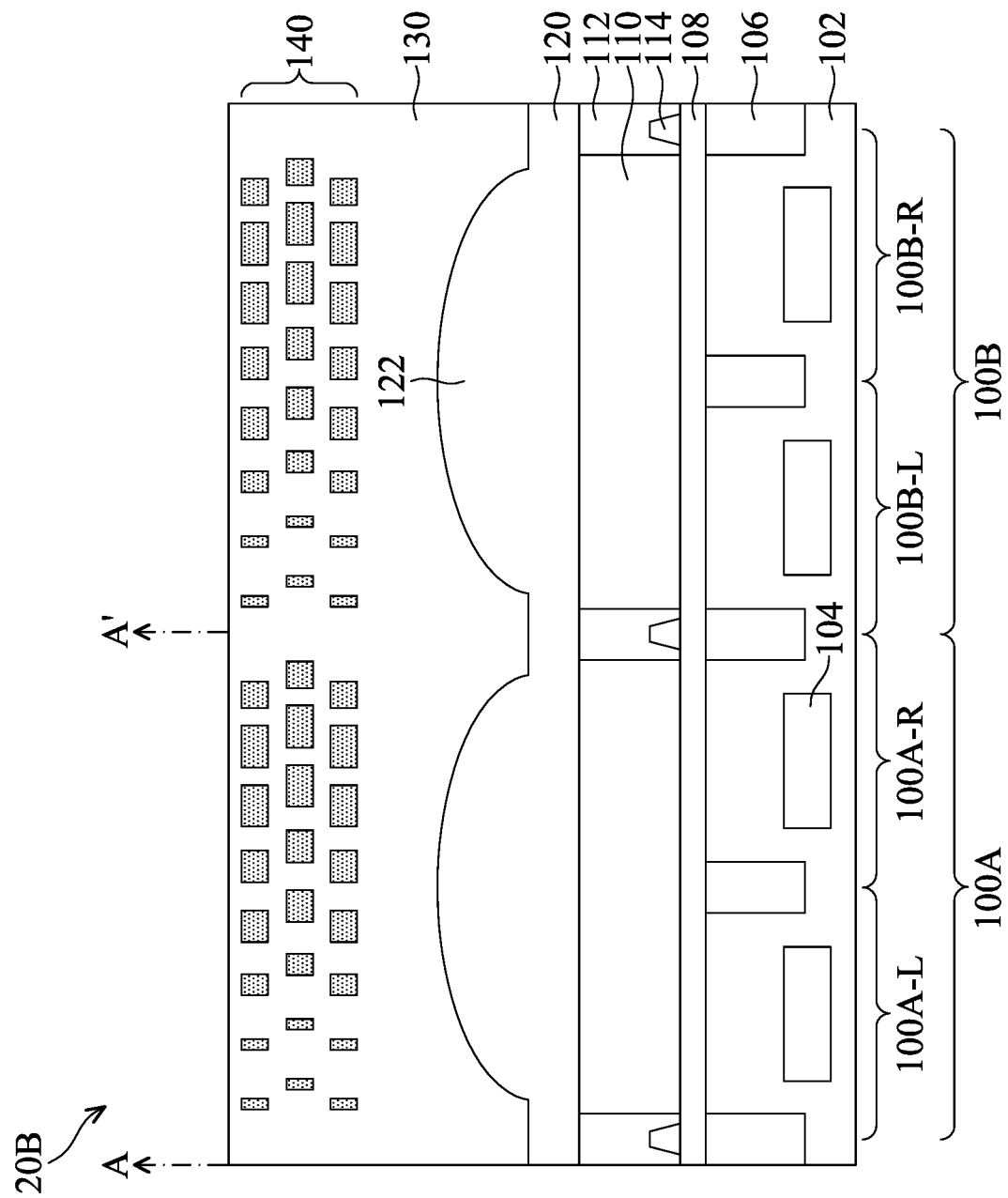
Figure 2C:
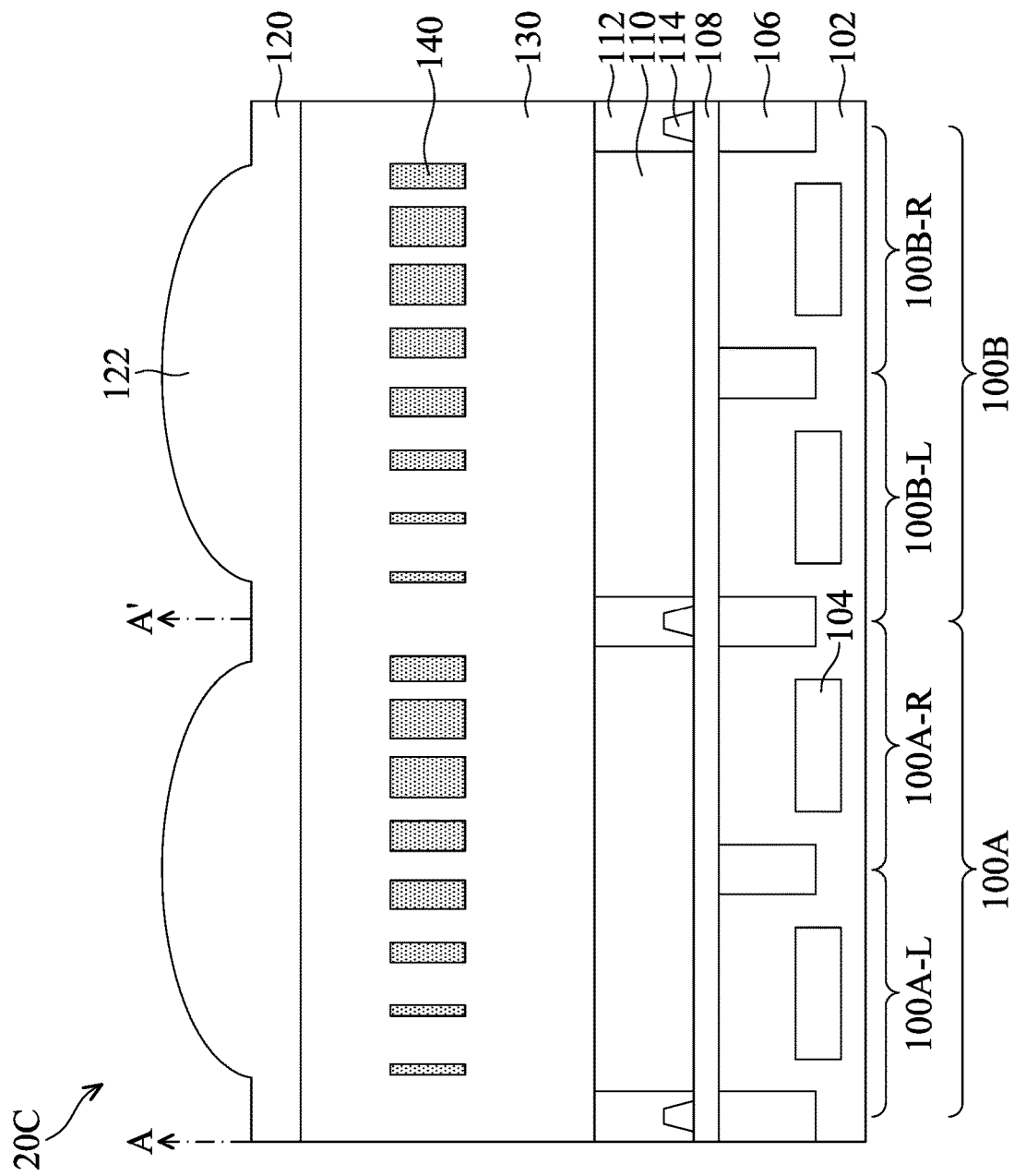

FIGS. 2A-2C are cross-sectional views of image sensors 20A, 20B, and 20C with various designs, according to some embodiments of the present disclosure. As mentioned previously, it is imperative to create a large difference between the refractive indices to generate a significantly large phase difference, so light waves may be split into different phase delays with different bent wavefronts. The configurations of the plurality of micro-lenses 122, the dielectric structure 130, and the plurality of polarization splitters 140 may vary, depending on the application or the design requirements. For illustrative purpose, the light waves L1 and the light waves L2 are omitted. The features of the substrate 102, the sensing portions 104, the deep trench isolation structure 106, the anti-reflection layer 108, the color filter layer 110, the partition grid structure 112, the light shielding structure 114, the micro-lens material layer 120, the plurality of micro-lenses 122, the dielectric structure 130, and the plurality of polarization splitters 140 are similar to those illustrated in FIG. 1A, and the details are not described again herein to avoid repetition.

Referring to FIG. 2A, the cross-sectional view of the image sensor 20A is illustrated. In comparison with FIG. 1A, the plurality of polarization splitters 140 of the image sensor 20A may be embedded within the dielectric structure 130. Instead of surrounding by ambient air, the plurality of polarization splitters 140 may be surrounded by the dielectric structure 130. There is still a large difference between the refractive indices of the dielectric structure 130 and the polarization splitters 140 to generate a large enough phase difference. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Referring to FIG. 2B, the cross-sectional view of the image sensor 20B is illustrated. In comparison with FIG. 2A, the plurality of polarization splitters 140 of the image sensor 20B may include three or more layers of shifted configurations. With the shifted configurations, the splitter pitch (or the x-axis pitch) and/or the group pitch (or the y-axis pitch) may remain the same as those in FIG. 1A, or may change depending on the design requirements. There is still a large difference between the refractive indices of the dielectric structure 130 and the polarization splitters 140 to generate a large enough phase difference. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Referring to FIG. 2C, the cross-sectional view of the image sensor 20C is illustrated. In comparison with FIG. 2A, the micro-lens material layer 120 and the plurality of micro-lenses 122 of the image sensor 20C may be disposed on the planarized top surface of the dielectric structure 130. Changing the configurations of the plurality of micro-lenses 122 and the dielectric structure 130 may affect the sensing performance depending on the design requirements. In other embodiments, the micro-lens material layer 120 and the plurality of micro-lenses 122 may be omitted. There is still a large difference between the refractive indices of the dielectric structure 130 and the polarization splitters 140 to generate a large enough phase difference. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 3:
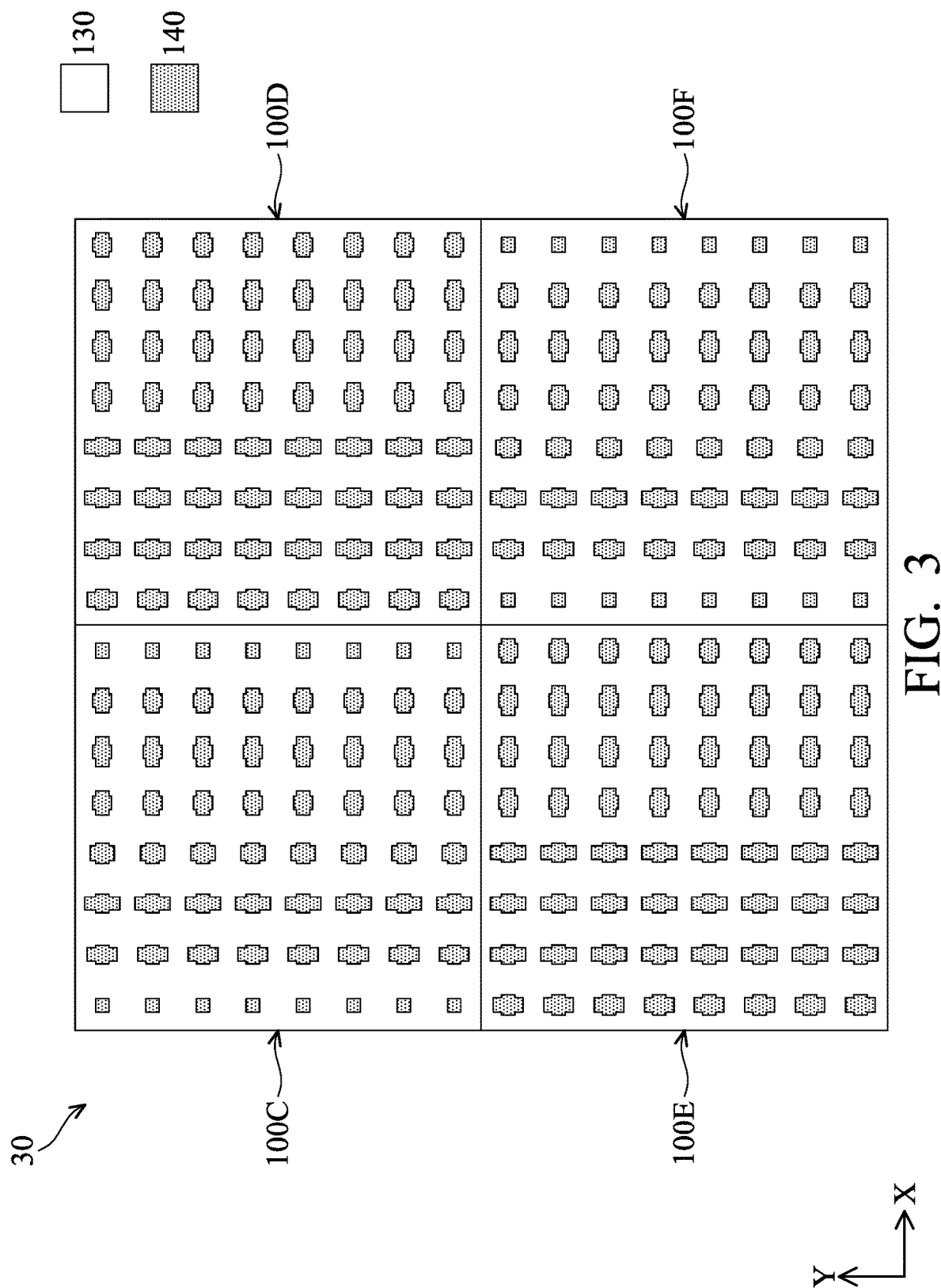
FIG. 3 is a top view of an image sensor, according to other embodiments of the present disclosure.

FIG. 3 is a top view of an image sensor 30, according to other embodiments of the present disclosure. When the color filter layer 110 within different groups of sensor units are designed to have different color units, the configurations of the plurality of polarization splitters 140 may also vary. For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1B, and the details are not described again herein to avoid repetition.

Referring to FIG. 3, a group of sensor units 100C, a group of sensor units 100D, a group of sensor units 100E, and a group of sensor units 100F are illustrated. According to some embodiments of the present disclosure, the group of sensor units 100C, the group of sensor units 100D, the group of sensor units 100E, and the group of sensor units 100F may include a green color unit, a red color unit, a blue color unit, and a green color unit, respectively. It should be noted that, since the group of sensor units 100C and the group of sensor units 100F are of the same color, the configurations of the plurality of polarization splitters 140 are substantially identical. In other embodiments, the dimension and the characteristics of some critical elements (such as the plurality of micro-lenses 122 and/or the dielectric structure 130) may be fine-tuned to allow the plurality of polarization splitters 140 to have the same configurations among the groups of sensor units 100C-100F with different colors. For example, since the light speed may equal to the light speed in vacuum divided by the refractive index of the color unit with the respective wavelength, adjusting the phase difference may also cause the traveling paths of the polarized light waves to change in compliance with different color units.

Figure 4A:
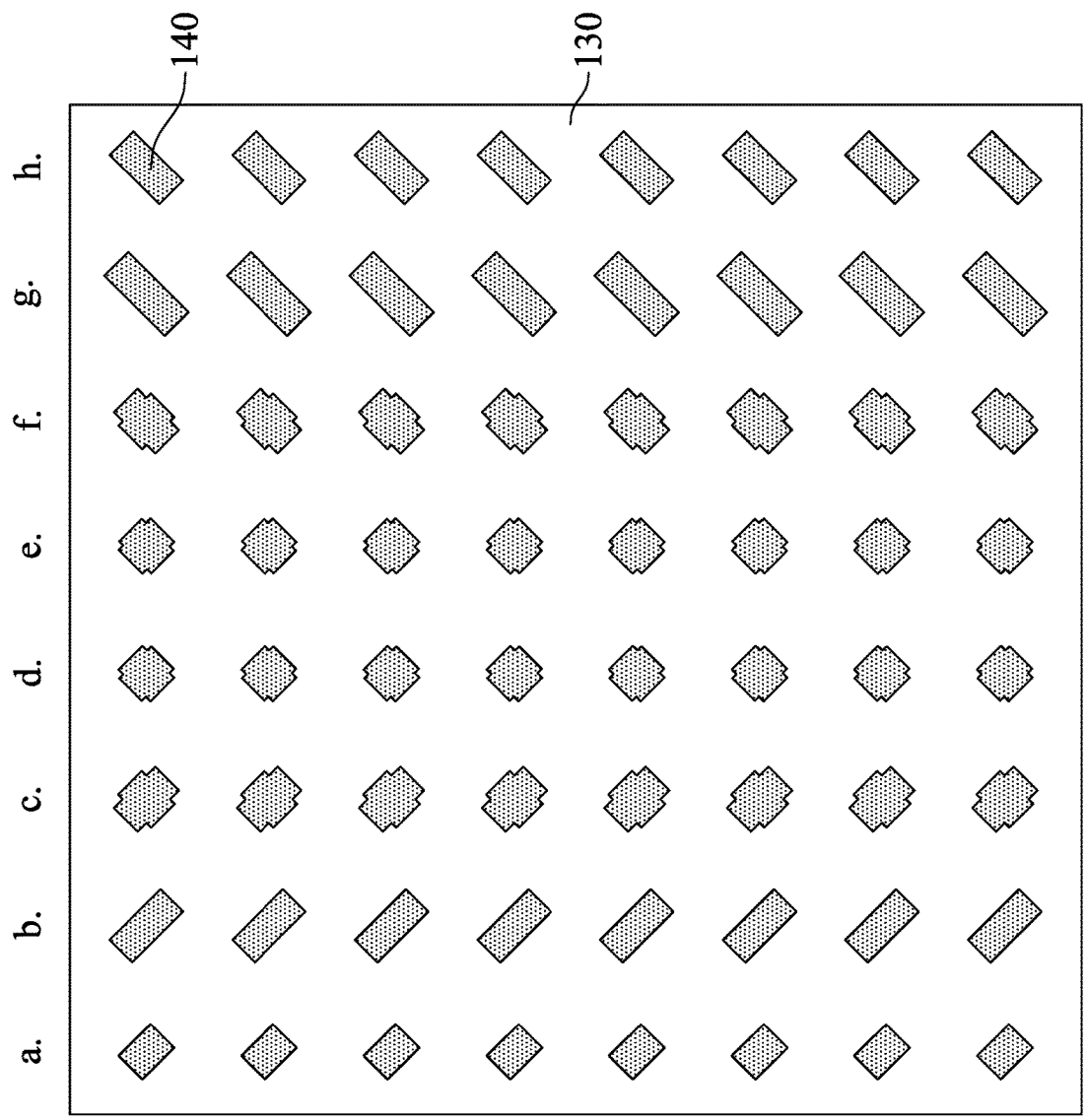
FIGS. 4A and 4B are top views of image sensors with various designs, according to some embodiments of the present disclosure.
Figure 4B:
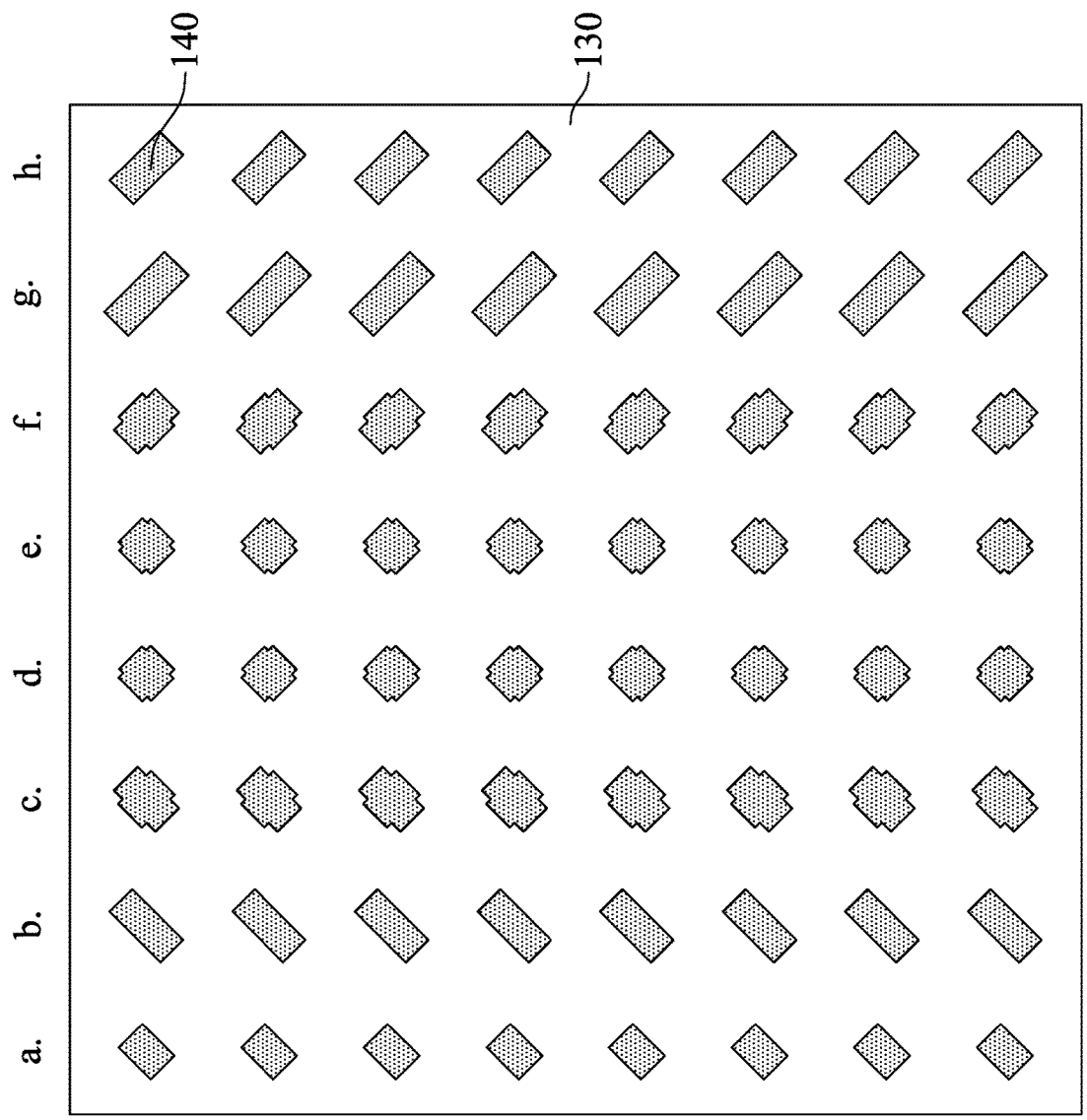

FIGS. 4A and 4B are top views of image sensors 40 with various designs, according to some embodiments of the present disclosure. In addition to the y-axis direction (the first direction) and the x-axis direction (the second direction), each of the plurality of polarization splitters 140 may also be oriented in a diagonal direction, in which the polarization may be analyzed through a proper algorithm. For example, instead of a 0° (y-axis) or a 90° (x-axis) orientation, the plurality of polarization splitters 140 may have ±45° orientations. For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1B, and the details are not described again herein to avoid repetition.

Referring to FIG. 4A, the top view of the image sensor 40 is illustrated. In comparison with FIG. 1B, each of the plurality of polarization splitters 140 of the image sensor 40 may be oriented by +45°. As mentioned above, the y-axis direction (the first direction) and the x-axis direction (the second direction) may be indicated by the 0° orientation and the 90° orientation, respectively. Even though the plurality of polarization splitters 140 of the image sensor 40 are oriented diagonally, the extending directions of the first meta element and the second meta element are still perpendicular to each other. The features of the structural group and the cycles thereof should remain unchanged. According to some embodiments of the present disclosure, the plurality of polarization splitters 140 having the meta feature may allow the light waves of all polarizations to transmit, but the light waves of different polarizations may be split and directed toward different sensor units. In other words, the optical energy loss may be minimized, while the quantum efficiency may be enhanced.

Referring to FIG. 4B, the top view of the image sensor 40 is illustrated. In comparison with FIG. 1B, each of the plurality of polarization splitters 140 of the image sensor 40 may be oriented by −45°. According to some embodiments of the present disclosure, the rotation magnitude (regardless of positive or negative directions) of each of the plurality of polarization splitters 140 is approximately between 0° and 90° from the top view. Even though the plurality of polarization splitters 140 of the image sensor 40 are oriented diagonally, the extending directions of the first meta element and the second meta element are still perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

FIGS. 5A-5G are top views of image sensors 50 with various designs, according to some embodiments of the present disclosure. The orientations of each of the plurality of polarization splitters 140, for example, the y-axis direction (the 0° orientation), the x-axis direction (the 90° orientation), and the diagonal direction (the ±45° orientations), may be integrated into various combinations among multiple groups of sensor units. The arrangement may be designed to realize certain functions or to analyze the incident angle of polarization through the proper algorithm. For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1B, and the details are not described again herein to avoid repetition.

Figure 5A:
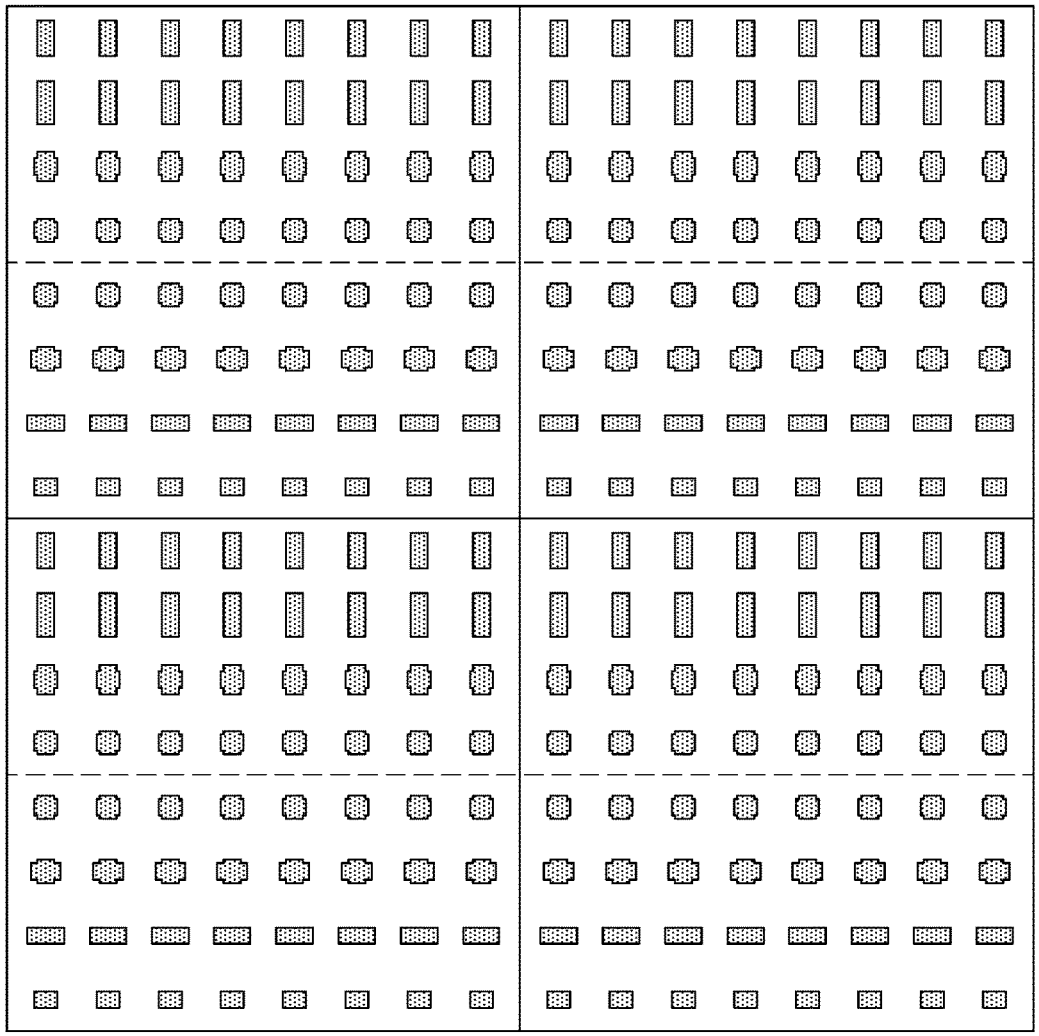
FIGS. 5A-5G are top views of image sensors with various designs, according to some embodiments of the present disclosure.

Referring to FIG. 5A, the top view of the image sensor 50 is illustrated. In comparison with FIG. 1B, the plurality of polarization splitters 140 are repeatedly arranged among four groups of sensor units. For every group of sensor units (defined by solid lines), the configurations of the plurality of polarization splitters 140 in the left sensor unit and the right sensor unit (separated by dash lines) may support the y-axis direction (the 0° orientation) polarization and the x-axis direction (the 90° orientation) polarization simultaneously. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 5B:
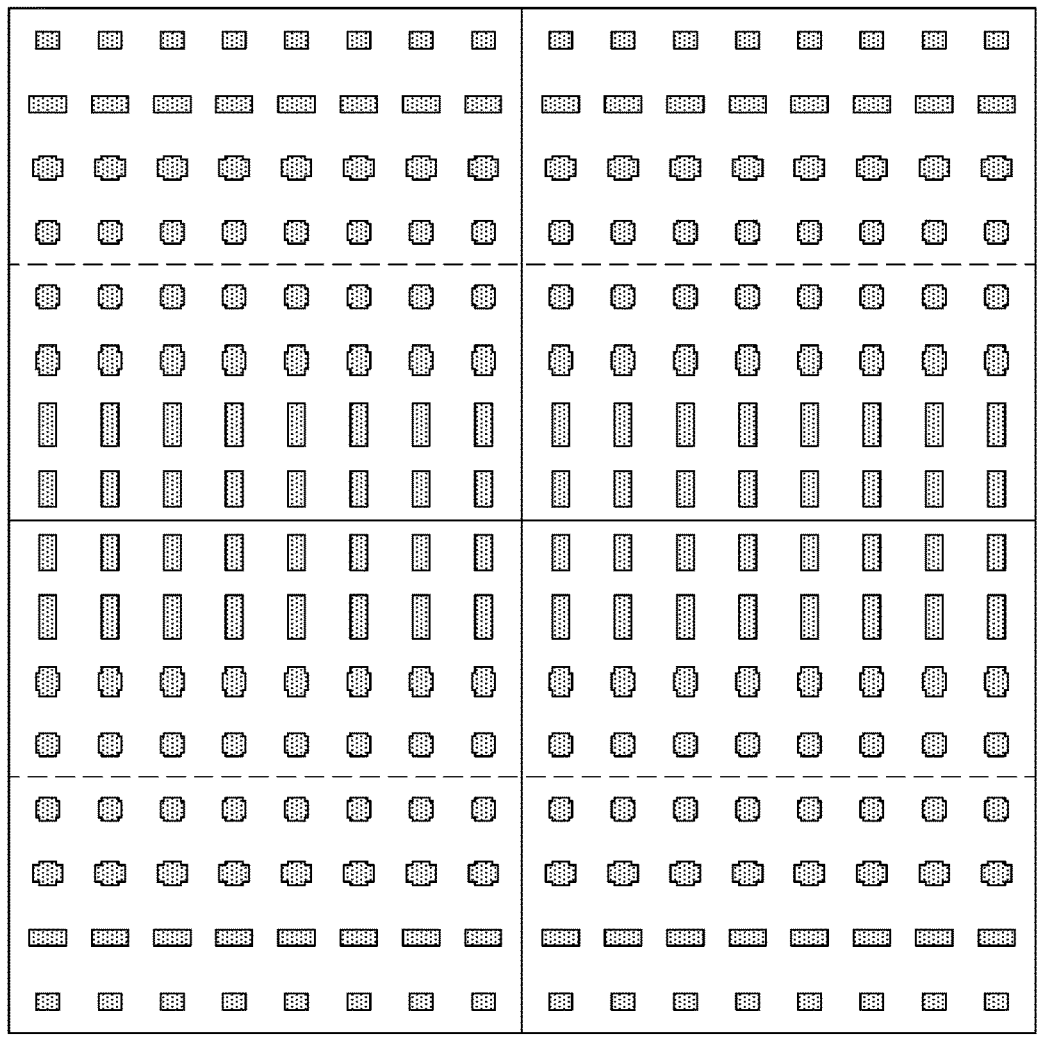

Referring to FIG. 5B, the top view of the image sensor 50 is illustrated. In comparison with FIG. 5A, for the upper right group of sensor units and the lower right group of sensor units, the configurations of the plurality of polarization splitters 140 in the left sensor units and the right sensor units are swapped. As a result, the light waves of the x-axis direction (90° orientation) polarization may be split and directed toward the center of the four groups of sensor units, in which the cross talk may be improved. In some embodiments, the cross talk is the reading of signal of different polarizations interfering with the desired polarization of the light wave, or the mixing of the light waves of different polarizations resulting in the decrease of the polarization ratio. The extending directions of the first meta element and the second meta element are perpendicular to each other. According to some embodiments of the present disclosure, the plurality of polarization splitters 140 having the meta feature may allow the light rays of different polarizations to transmit, but the light waves of different polarizations may be split and directed toward different sensor units. In other words, the optical energy loss may be minimized, while the quantum efficiency may be enhanced.

Figure 5C:
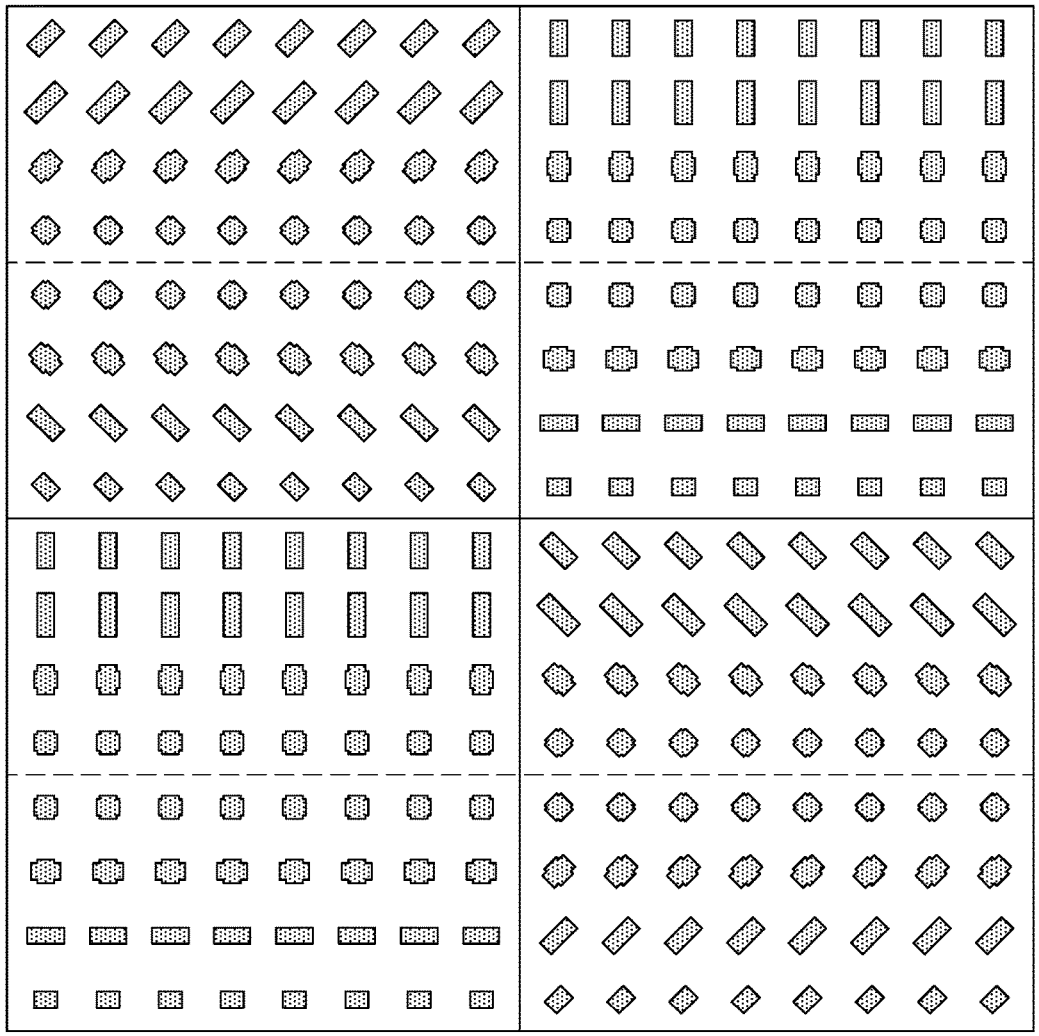

Referring to FIG. 5C, the top view of the image sensor 50 is illustrated. In comparison with FIG. 5A, for the upper right group of sensor units, the configurations of the plurality of polarization splitters 140 in the left sensor units and the right sensor units (separated by dash lines) may support the −45° orientation polarization and the +45° orientation polarization simultaneously. Moreover, for the lower left group of sensor units, the configurations of the plurality of polarization splitters 140 in the left sensor units and the right sensor units may support the +45° orientation polarization and the −45° orientation polarization simultaneously. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 5D:
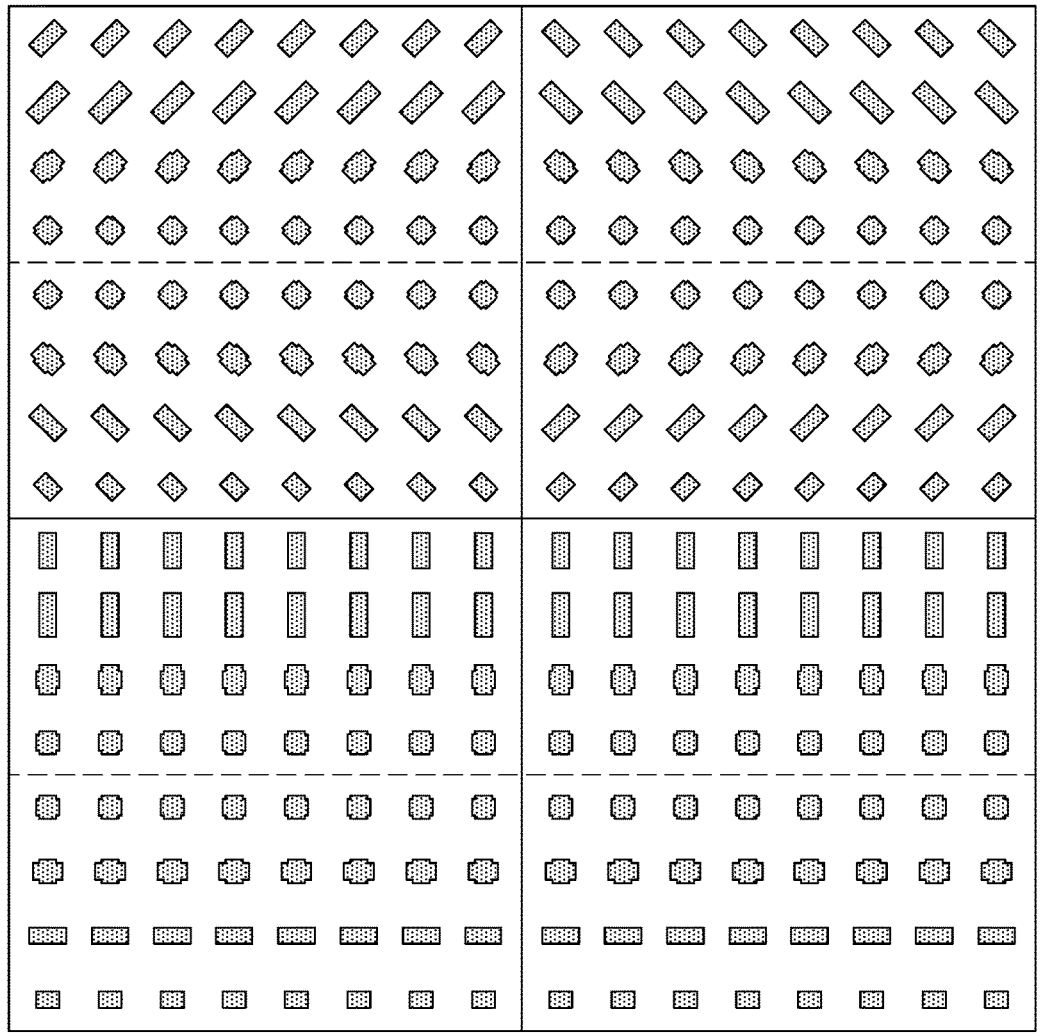

Referring to FIG. 5D, the top view of the image sensor 50 is illustrated. In comparison with FIG. 5A, for the upper right group of sensor units, the configurations of the plurality of polarization splitters 140 in the left sensor units and the right sensor units (separated by dash lines) may support the −45° orientation polarization and the +45° orientation polarization simultaneously. Moreover, for the lower right group of sensor units, the configurations of the plurality of polarization splitters 140 in the left sensor units and the right sensor units (separated by dash lines) may support the +45° orientation polarization and the −45° orientation polarization simultaneously. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 5E:
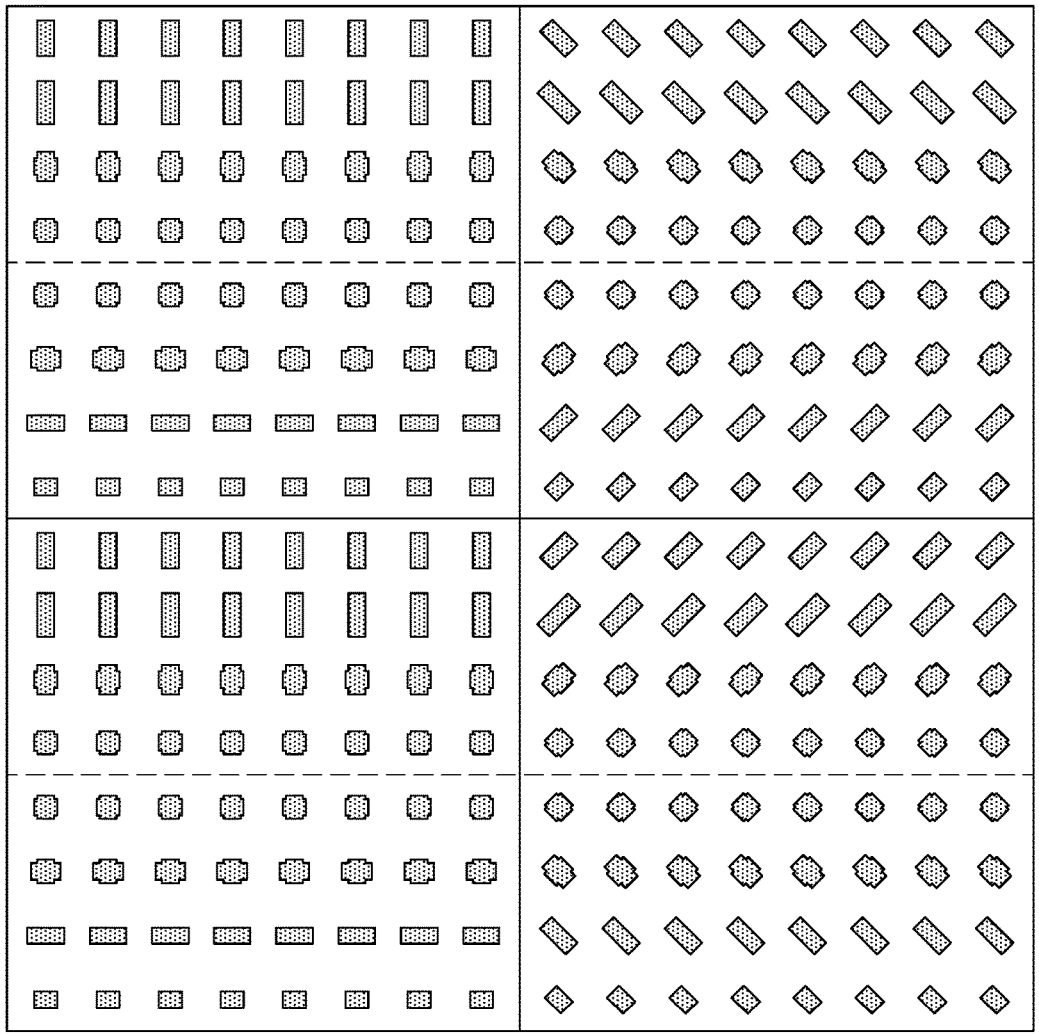

Referring to FIG. 5E, the top view of the image sensor 50 is illustrated. In comparison with FIG. 5A, for the lower left group of sensor units, the configurations of the plurality of polarization splitters 140 in the left sensor units and the right sensor units (separated by dash lines) may support the −45° orientation polarization and the +45° orientation polarization simultaneously. Moreover, for the lower right group of sensor units, the configurations of the plurality of polarization splitters 140 in the left sensor units and the right sensor units (separated by dash lines) may support the +45° orientation polarization and the −45° orientation polarization simultaneously. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 5F:
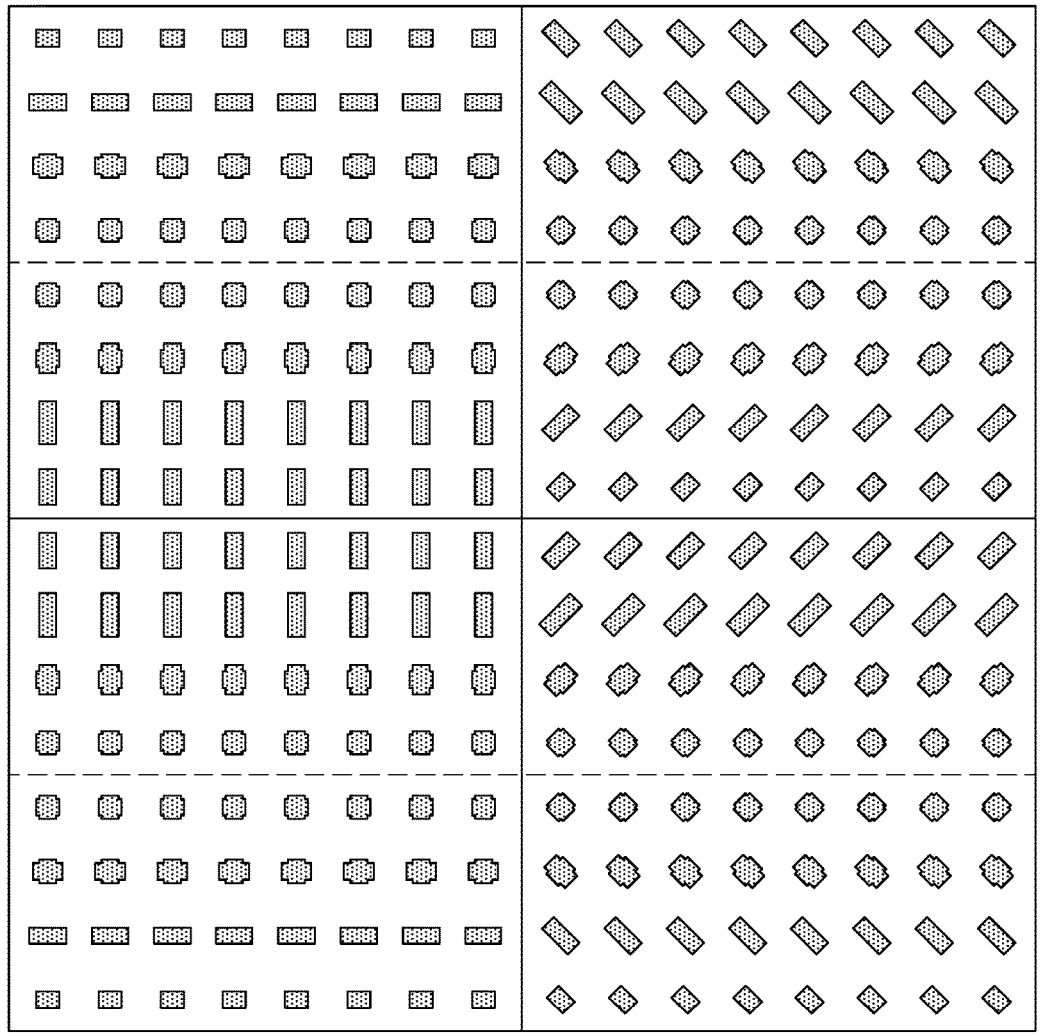

Referring to FIG. 5F, the top view of the image sensor 50 is illustrated. In comparison with FIG. 5A, for the upper right group of sensor units, the configurations of the plurality of polarization splitters 140 in the left sensor units and the right sensor units (separated by dash lines) are swapped. For the lower left group of sensor units, the configurations of the plurality of polarization splitters 140 in the left sensor units and the right sensor units (separated by dash lines) may support the −45° orientation polarization and the +45° orientation polarization simultaneously. Moreover, for the lower right group of sensor units, the configurations of the plurality of polarization splitters 140 in the left sensor units and the right sensor units (separated by dash lines) may support the +45° orientation polarization and the −45° orientation polarization simultaneously. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 5G:
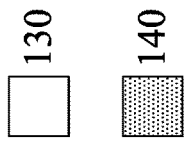
Figure 5G:
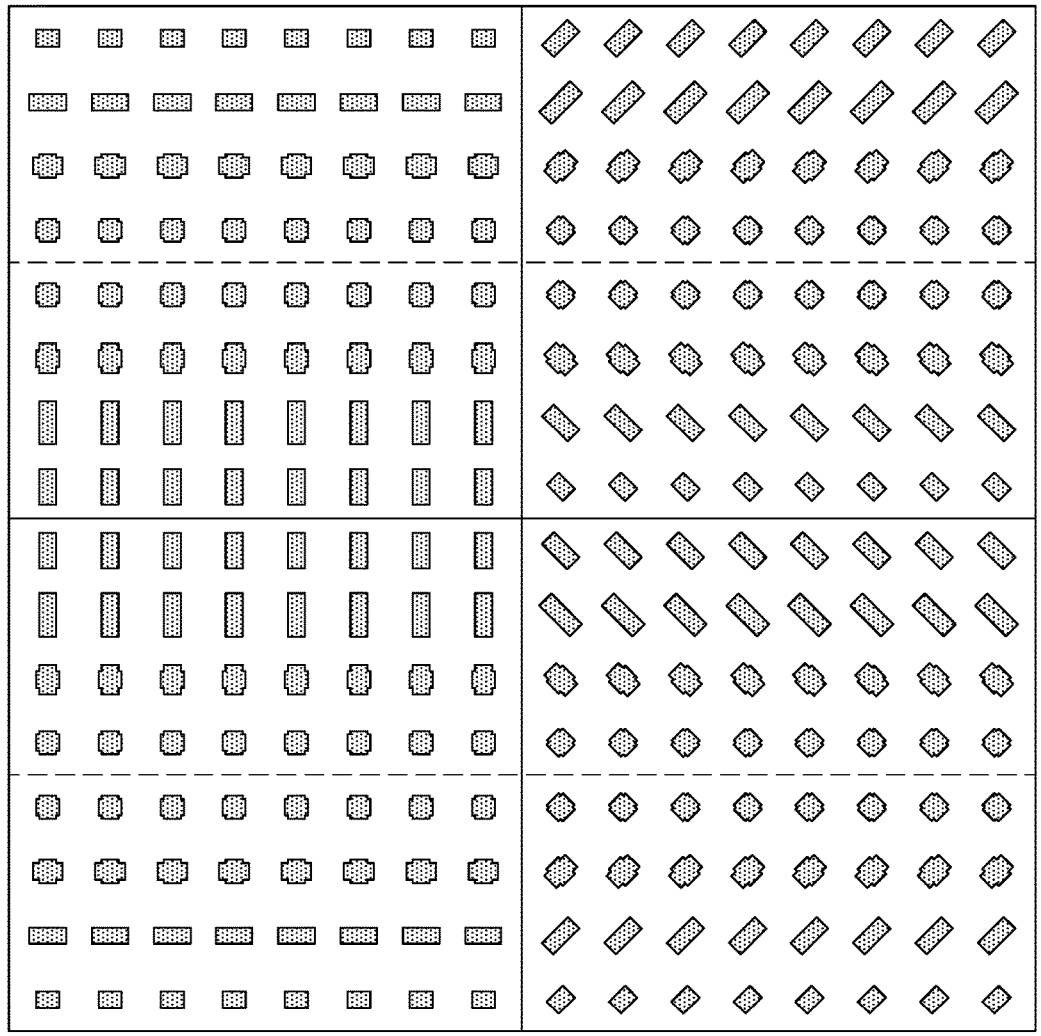

Referring to FIG. 5G, the top view of the image sensor 50 is illustrated. In comparison with FIG. 5F, for the lower left group of sensor units and the lower right group of sensor units, the configurations of the plurality of polarization splitters 140 in the left sensor units and the right sensor units (separated by dash lines) are swapped. The extending directions of the first meta element and the second meta element are perpendicular to each other. According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Figure 6:
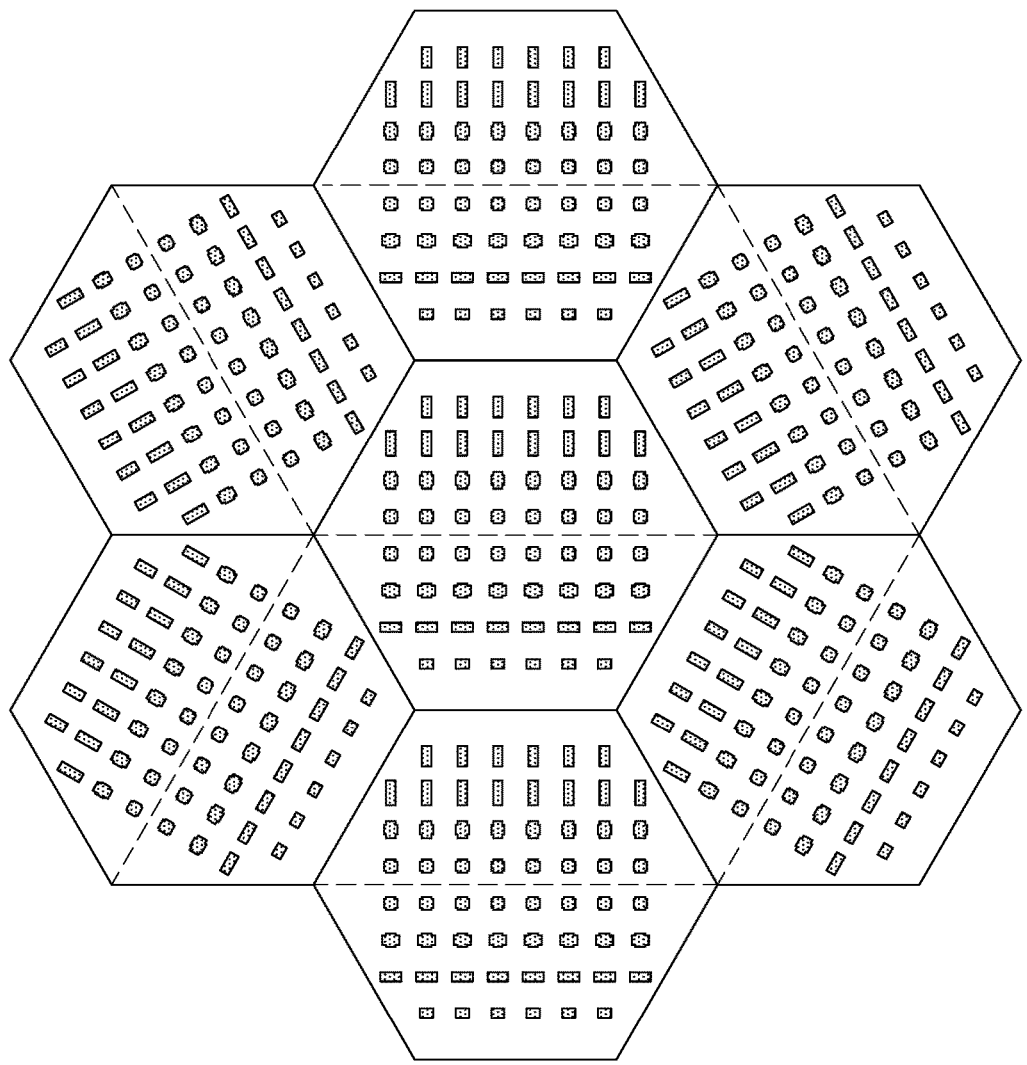
FIG. 6 is a top view of an image sensor, according to yet other embodiments of the present disclosure.

FIG. 6 is a top view of an image sensor 60, according to yet other embodiments of the present disclosure. In addition of being a rectangular shape, the groups of sensor units may also be a hexagonal shape from the top view. For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1B, and the details are not described again herein to avoid repetition.

Referring to FIG. 6, the top view of the image sensor 60 is illustrated. In comparison with FIG. 1B, the oriented polarization splitters 140 in the groups of sensor units of hexagonal shape may more effectively minimize the optical energy loss. However, the arrangement of the plurality of polarization splitters 140 within each group of sensor units may be incomplete (for example, some polarization splitters 140 near the edge may need to be removed due to the hexagonal shape nature). Even though the light distribution may be compromised, the performance may not be notably affected for sensor units of larger dimension. For the middle three groups of sensor units, the configurations of the plurality of polarization splitters 140 in the left sensor unit and the right sensor unit (separated by dash lines) may support the y-axis direction (the 0° orientation) polarization and the x-axis direction (the 90° orientation) polarization simultaneously. For the upper left group of sensor units and the lower left group of sensor units, the configurations of the plurality of polarization splitters 140 in the left sensor units and the right sensor units (separated by dash lines) may support the −60° orientation polarization and the +30° orientation polarization splitters simultaneously. Furthermore, for the upper right group of sensor units and the lower right group of sensor units, the configurations of the plurality of polarization splitters 140 in the left sensor units and the right sensor units (separated by dash lines) may support the −30° orientation polarization splitters and the +60° orientation polarization splitters simultaneously. It should be appreciated that the polarization of the light wave received by each sensor unit is determined by the orientation of the plurality of polarization splitters 140, instead of the structural orientation of the hexagonal shape of the groups of sensor units. However, the hexagonal structure of each group of sensor units supports two oriented polarizations.

Figure 7:
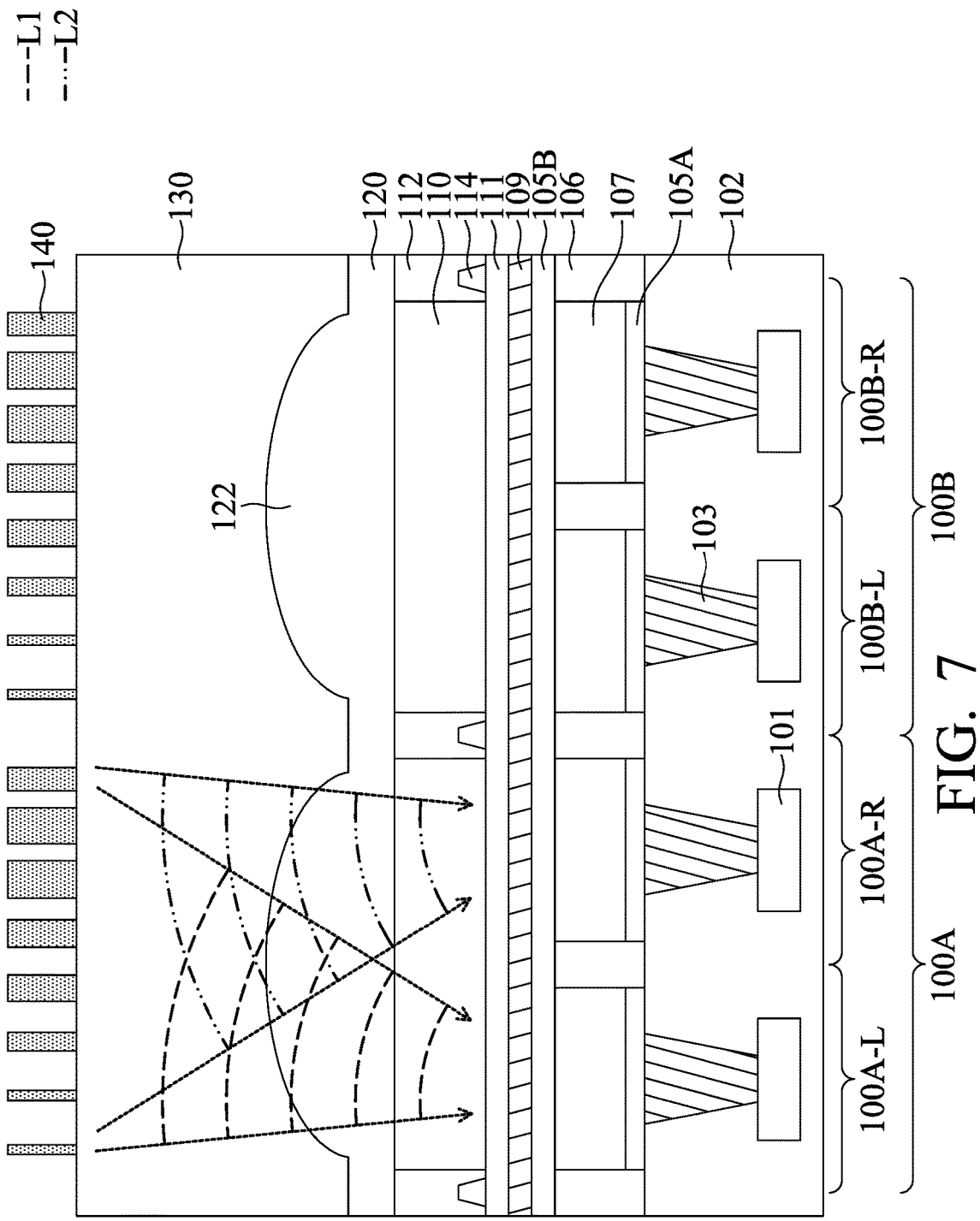
FIG. 7 is a cross-sectional view of an image sensor, according to yet other embodiments of the present disclosure.

FIG. 7 is a cross-sectional view of an image sensor 70, according to yet other embodiments of the present disclosure. In the present embodiment, the image sensor 70 may be an organic photo diode (OPD) incorporated with the plurality of polarization splitters 140. The organic photo diode may be highly sensitive to near infrared (NIR), which tends to have relatively low quantum efficiency conventionally. By introducing the innovative meta feature of the polarization splitters 140, the improvement on quantum efficiency should be clearly observed. The features of the substrate 102, the deep trench isolation structure 106, the color filter layer 110, the partition grid structure 112, the light shielding structure 114, the micro-lens material layer 120, the plurality of micro-lenses 122, the dielectric structure 130, the plurality of polarization splitters 140, the light wave L1, and the light wave L2 are similar to those illustrated in FIG. 1A, and the details are not described again herein to avoid repetition.

Referring to FIG. 7, an organic photoconductive film (OPF) 107 may be disposed below the color filter layer 110. The function of the organic photoconductive film 107 is to convert photons to electrons. In some embodiments, the organic photoconductive film 107 may be compartmentalized by the deep trench isolation structure 106. The materials and the formation of the deep trench isolation structure 106 may be similar to those illustrated in FIG. 1A, and the details are not described again herein to avoid repetition. The thickness of the organic photoconductive film 107 may be approximately between 0.05 μm and 0.70 μm. Materials of the organic photoconductive film 107 may include small molecules (such as fluorene dithiophene (FDT), copper phthalocyanine (CuPc), lead phthalocyanine (PbPc), chloroaluminum phthalocyanine (AlClPc)), fullerene (such as C70, C60), the like, or a combination thereof. The organic photoconductive film 107 may be formed by any suitable deposition process mentioned above.

Still referring to FIG. 7, an electron transport layer (ETL) 105A and a hole transport layer (HTL) 105B may be respectively formed below and above the organic photoconductive film 107. In some embodiments, the electron transport layer 105A may be located vertically between the substrate 102 and the organic photoconductive film 107, while the hole transport layer 105B may be located vertically between the color filter layer 110 and the organic photoconductive film 107. The electron transport layer 105A and the hole transport layer 105B may be considered as the buffer layers for anode connection and cathode connection, respectively. The thickness of the electron transport layer 105A or the hole transport layer 105B may be approximately between 10 nm and 100 nm. Materials of the electron transport layer 105A and the hole transport layer 105B may include polymers (such as polybis(thienyl)thienodia-thiazolethiophene (PDDTT), poly[2,3-bis(4-(2-ethyl hexyloxy) phenyl)-5,7-di(thiophen-2-yl)thieno[3,4-b]pyrazine] (PDTTP), poly {2,2'-[(2,5-bis(2-hexyldecyl)-3,6-dioxo-2,3, 5,6-tetrahydropyrrolo[3,4-c]pyrrole-1,4-diyl)dithiophene]-5,5'-diyl-alt-thiophen-2,5-diyl} (PDPP3T), thienyl-diketopyrrolopyrrole-thieno-thiophene (PDPPTTT), poly{4,8-bis [5-(2-ethylhexyl)thiophen-2-yl]benzo[1,2-b:4,5-b']-dithiophene-2,6-diyl-alt-3-fluoro-2-[(2-ethylhexyl) carbonyl]-thieno[3,4-b]thiophene-4,6-diyl} (PTB7-Th)), any suitable organic materials, the like, or a combination thereof. The electron transport layer 105A and the hole transport layer 105B may be formed by any suitable deposition process mentioned above.

Referring to FIG. 7, a bottom electrode 103 and a top electrode 109 may be disposed below the electron transport layer 105A and above the hole transport layer 105B, respectively. The bottom electrode 103 and the top electrode 109 may respectively serve as the cathode contact and the anode contact. The thickness of the bottom electrode 103 may depend on the design of the substrate 102. The thickness of the top electrode 109 may be approximately between 50 nm and 300 nm. Materials of the bottom electrode 103 may include amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (such as tantalum carbide (TaC), tantalum carbonitride (TaCN), or the like), metal oxide, or metals. Metals may include cobalt (Co), ruthenium (Ru), aluminum (Al), tungsten (W), copper (Cu), titanium (Ti), tantalum (Ta), silver (Ag), gold (Au), platinum (Pt), nickel (Ni), the like, a combination thereof, or a multiple layer thereof. Materials of the top electrode 109 may include transparent conductive materials, such as indium tin oxide (ITO), tin oxide (SnO), indium zinc oxide (IZO), indium gallium zinc oxide (IGZO), indium tin zinc oxide (ITZO), antimony tin oxide (ATO), aluminum-doped zinc oxide (AZO), titanium dioxide ($TiO_2$), the like, or a combination thereof. The bottom electrode 103 and the top electrode 109 may be formed by physical vapor deposition, atomic layer deposition, plating, sputtering, the like, or a combination thereof.

Still referring to FIG. 7, a plurality of circuit portions 101 may be electrically connected to the bottom electrode 103. In some embodiments, the plurality of circuit portions 101 and the bottom electrode 103 are both embedded within the substrate 102. The function of the plurality of circuit portions 101 is to connect to circuit system and to form charge storage region. The plurality of circuit portions 101 may include any suitable insulating and conductive materials mentioned above. For example, the plurality of circuit portions 101 may be a laminated structure having the insulating layers and the conductive layers that are alternately arranged.

Referring to FIG. 7, a passivation layer 111 may be disposed on the top electrode 109. The passivation layer 111 may provide isolation between the organic photoconductive film 107 and the overlying the color filter layer 110. The thickness of the passivation layer 111 may be approximately between 50 nm and 1000 nm. The materials and the formation of the passivation layer 111 may be similar to those of the dielectric structure 130, and the details are not described again herein to avoid repetition.

Figure 8A:
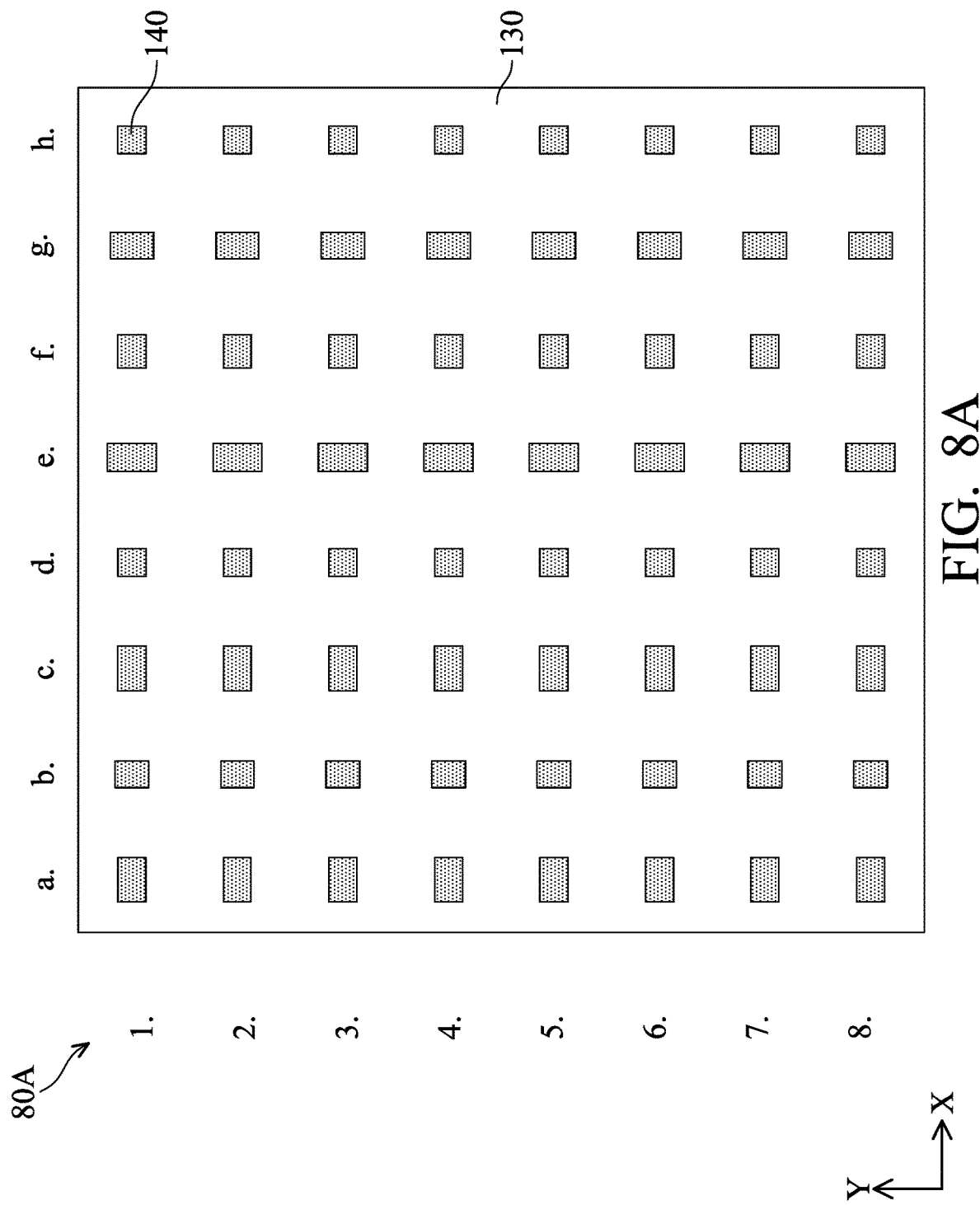
FIGS. 8A and 8B are top views of image sensors with various designs, according to some embodiments of the present disclosure.
Figure 8B:
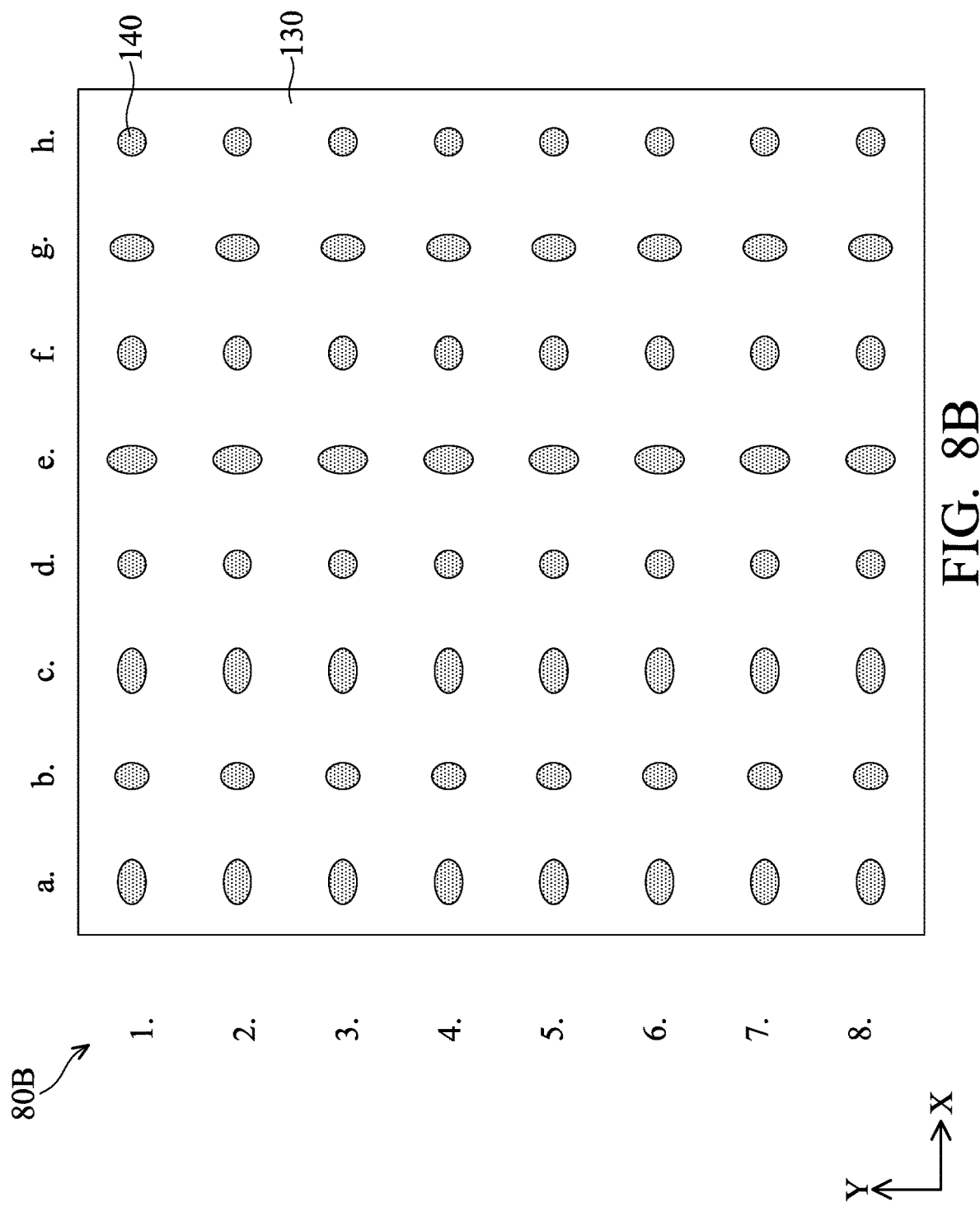

FIGS. 8A and 8B are top views of image sensors 80A and 80B with various designs, according to some embodiments of the present disclosure. Each of the plurality of polarization splitters 140 may appear to be a rectangular shape or an elliptical shape. For illustrative purpose, the substrate 102, the sensing portions 104, the deep trench isolation structure 106, the anti-reflection layer 108, the color filter layer 110, the partition grid structure 112, the light shielding structure 114, the micro-lens material layer 120, and the plurality of micro-lenses 122 are omitted. The features of the dielectric structure 130 and the plurality of polarization splitters 140 are similar to those illustrated in FIG. 1B, and the details are not described again herein to avoid repetition.

Referring to FIG. 8A, the top view of the image sensor 80A is illustrated. In comparison with FIG. 1B, the plurality of polarization splitters 140 of the image sensor 80A may all appear to be rectangular. As mentioned previously, the polarization splitters 140 from column a to column h of each row constitute a structural group, and the structural group may be repeatedly arranged in cycles from row 1 to row 8.

Even though the plurality of polarization splitters 140 shown in FIG. 8A do not appear to be cross-shape, each of the plurality of polarization splitters 140 may still include the first meta element and the second meta element that extend in the y-axis direction and the x-axis direction, respectively. When both the first meta element and the second meta element have minimal extension in the y-axis direction and the x-axis direction, respectively, a square shape of the polarization splitters 140 may be displayed (for example, the polarization splitters 140 in columns d and h). According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

Referring to FIG. 8B, the top view of the image sensor 80B is illustrated. In comparison with FIG. 8A, the plurality of polarization splitters 140 of the image sensor 80B may all appear to be elliptical. Even without a cross-shape configuration, each of the plurality of polarization splitters 140 may still include the first meta element and the second meta element that extend in the y-axis direction and the x-axis direction, respectively. When both the first meta element and the second meta element have minimal extension in the y-axis direction and the x-axis direction, respectively, a circular shape of the polarization splitters 140 may be displayed (for example, the polarization splitters 140 in columns d and h). According to some embodiments of the present disclosure, the plurality of polarization splitters 140 having the meta feature may allow the light waves of different polarizations to transmit, but the light waves of different polarizations may be split and directed toward different sensor units. In other words, the optical energy loss may be minimized, while the quantum efficiency may be enhanced.

By incorporating the plurality of polarization splitters having the innovative meta feature into a standard image sensor, the incident light waves of different polarizations may be transmitted for reception. The innovative meta feature may control the transmitting directions of different polarized light waves, allowing the light waves of different polarizations to be directed toward different sensing portions within the group of sensor units. Since the polarization splitters will not reflect away or absorb light waves with unwanted polarizations, the optical energy loss may be minimized, while the quantum efficiency may be enhanced.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:
  a group of sensor units;
  a color filter layer disposed within the group of sensor units; and
  a dielectric structure and a plurality of polarization splitters disposed corresponding to the color filter layer,
  wherein each of the plurality of polarization splitters has a first meta element extending in a first direction from top view and a second meta element extending in a second direction perpendicular to the first direction from top view.

2. The image sensor of claim 1, wherein at least three of the plurality of polarization splitters constitute a structural group.

3. The image sensor of claim 2, wherein the structural group is repeatedly arranged in cycles.

4. The image sensor of claim 2, wherein a splitter pitch between the plurality of polarization splitters within the structural group is between 150 nm and 600 nm.

5. The image sensor of claim 3, wherein a group pitch between the cycles is between 150 nm and 600 nm.

6. The image sensor of claim 1, wherein each of the plurality of polarization splitters has a cross shape, a rectangular shape, or an elliptical shape from top view.

7. The image sensor of claim 1, wherein a critical dimension (CD) of the first meta element or the second meta element of each of the plurality of polarization splitters is between 50 nm and 300 nm from top view.

8. The image sensor of claim 1, wherein a length of the first meta element or the second meta element of each of the plurality of polarization splitters is between 50 nm and 400 nm from top view.

9. The image sensor of claim 1, wherein a rotation magnitude of each of the plurality of polarization splitters is between 0° and 90° from top view.

10. The image sensor of claim 1, wherein a height of each of the plurality of polarization splitters is between 0.1 μm and 1.5 μm.

11. The image sensor of claim 1, wherein a refractive index of the plurality of polarization splitters is between 1.7 and 3.5.

12. The image sensor of claim 1, wherein a refractive index of the dielectric structure is between 1 and 1.8.

13. The image sensor of claim 1, wherein the plurality of polarization splitters are disposed on a top surface of the dielectric structure or within the dielectric structure.

14. The image sensor of claim 1, wherein the plurality of polarization splitters comprises multiple layers of shifted configurations.

15. The image sensor of claim 1, further comprising a micro-lens disposed above or below the dielectric structure.

16. The image sensor of claim 1, wherein the group of sensor units is a rectangular shape or a hexagonal shape from top view.

17. The image sensor of claim 1, further comprising:
- a plurality of sensing portions embedded within a substrate; and
- a deep trench isolation (DTI) structure separating each of the plurality of sensing portions.

18. The image sensor of claim 1, further comprising:
- a partition grid structure laterally surrounding the color filter layer of the group of sensor units; and
- a light shielding structure embedded within the partition grid structure.

19. The image sensor of claim 1, wherein the image sensor is an organic photo diode (OPD).

20. The image sensor of claim 19, wherein the organic photo diode further comprising:
- an organic photoconductive film (OPF) disposed below the color filter layer;
- an electron transport layer (ETL) disposed vertically between a substrate and the organic photoconductive film; and
- a hole transport layer (HTL) disposed vertically between the color filter layer and the organic photoconductive film.

* * * * *